(12) United States Patent
Li et al.

(10) Patent No.: US 12,495,723 B2
(45) Date of Patent: Dec. 9, 2025

(54) PHASE CHANGE MATERIAL (PCM) SWITCH WITH VARIABLY SPACED SPREADER LAYER STRUCTURES AND METHODS OF FORMING THE SAME

(71) Applicant: Taiwan Semiconductor Manufacturing Company Limited, Hsinchu (TW)

(72) Inventors: Fu-Hai Li, Tainan (TW); Kuo-Ching Huang, Hsinchu (TW); Yi Ching Ong, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 419 days.

(21) Appl. No.: 18/304,513

(22) Filed: Apr. 21, 2023

(65) Prior Publication Data
US 2024/0114812 A1 Apr. 4, 2024

Related U.S. Application Data

(60) Provisional application No. 63/411,731, filed on Sep. 30, 2022.

(51) Int. Cl.
*H10N 70/00* (2023.01)
*H04B 1/44* (2006.01)
*H10N 70/20* (2023.01)

(52) U.S. Cl.
CPC ....... *H10N 70/8613* (2023.02); *H10N 70/011* (2023.02); *H10N 70/231* (2023.02);
(Continued)

(58) Field of Classification Search
CPC ............ H10N 70/8613; H10N 70/011; H10N 70/231; H10N 70/823; H10N 70/8413;
(Continued)

(56) References Cited

U.S. PATENT DOCUMENTS 10,062,636 B2 * 8/2018 Howard ............... H10D 84/645
2020/0058864 A1 2/2020 El-Hinnawy et al.
(Continued)

FOREIGN PATENT DOCUMENTS

CN 114188479 A 3/2022

OTHER PUBLICATIONS

Jianq Chyun Intellectual Property Office; TW Application No. 112122377; Office Action mailed Jun. 5, 2024; 16 pages.

*Primary Examiner* — Allison Bernstein
(74) *Attorney, Agent, or Firm* — The Marbury Law Group, PLLC

(57) ABSTRACT

A switch includes a heater layer, a phase change material (PCM) layer on the heater layer, and a spreader layer formed in proximity to the PCM layer and including a central region with a first thermal conductivity and an edge region with a second thermal conductivity different than the first thermal conductivity. A method of forming a switch includes forming a heater layer, forming a phase change material (PCM) layer on the heater layer, and forming a spreader layer in proximity to the PCM layer, such that the spreader layer includes a central region with a first thermal conductivity and an edge region with a second thermal conductivity different than the first thermal conductivity.

20 Claims, 27 Drawing Sheets

(52) U.S. Cl.
CPC ....... *H10N 70/823* (2023.02); *H10N 70/8413* (2023.02); *H04B 1/44* (2013.01)

(58) Field of Classification Search
CPC ............. H10N 70/861; H10N 70/8828; H10N 70/8833; H04B 1/44
See application file for complete search history.

(56) References Cited

U.S. PATENT DOCUMENTS

| | | |
|---|---|---|
| 2020/0058869 A1 | 2/2020 | Slovin et al. |
| 2020/0287132 A1 | 9/2020 | Slovin et al. |
| 2021/0320250 A1 | 10/2021 | Heiss et al. |
| 2024/0130257 A1* | 4/2024 | Li ........................ H10N 70/026 |
| 2024/0224823 A1* | 7/2024 | Li ....................... H10N 70/8613 |

* cited by examiner

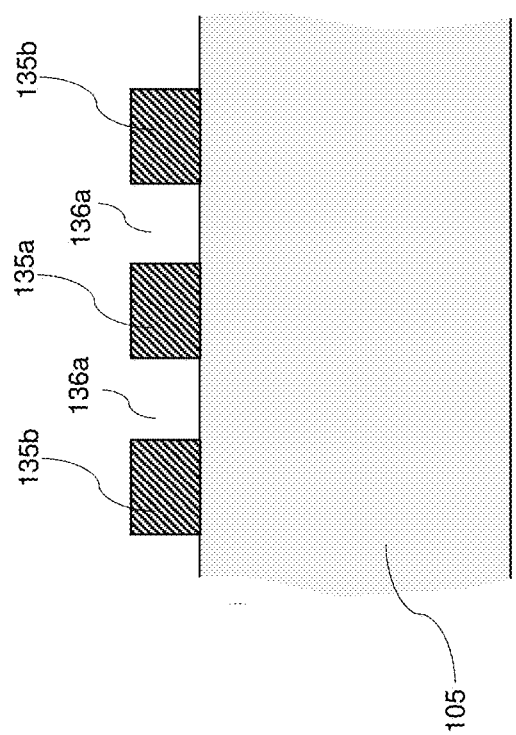
FIG. 1E
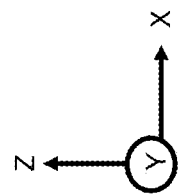

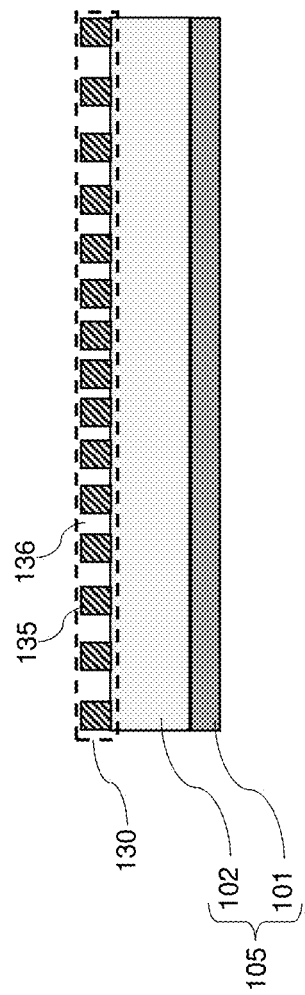
FIG. 2B
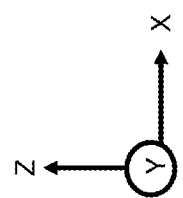

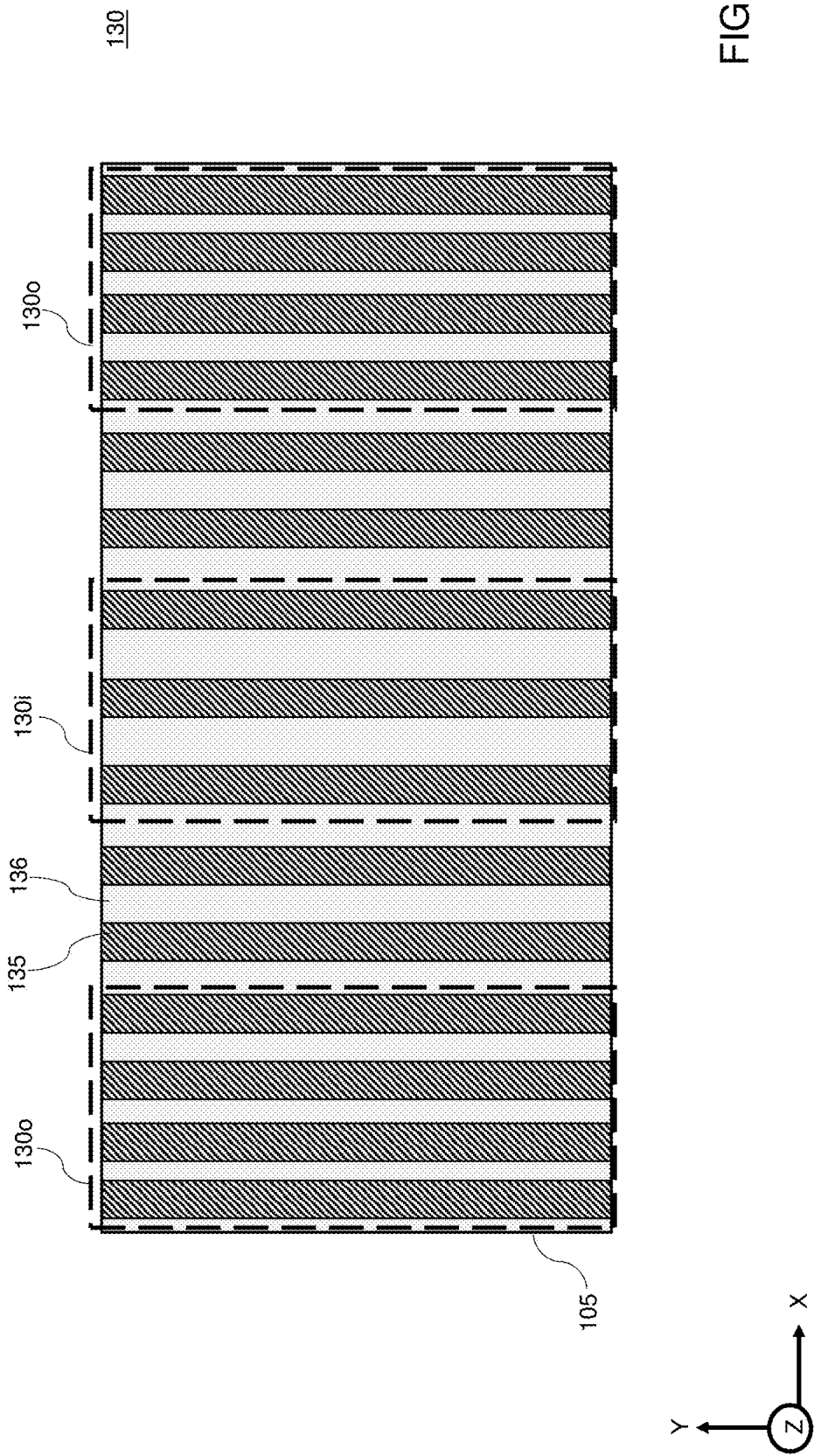

PHASE CHANGE MATERIAL (PCM) SWITCH WITH VARIABLY SPACED SPREADER LAYER STRUCTURES AND METHODS OF FORMING THE SAME

RELATED APPLICATIONS

This application claims priority from U.S. Provisional Application Ser. No. 63/411,731 entitled "Phase Change Material (Pcm) Switch With Variably Spaced Spreader Layer Structures And Methods Of Forming The Same," filed on Sep. 30, 2022, the entire contents of which are incorporated herein by reference for all purposes.

BACKGROUND

Electronic devices may utilize switches to route a signal along a transmission path. For example, a communication device (e.g., cell phone) may include many antenna elements and multiple radio streams to ensure high data rate wireless communications, whether through cellular or mobile connectivity networks and peripheral devices. The communication device may utilize radio frequency (RF) switches to route an RF signal along a transmission path that may include multiple RF components such as amplifiers, filters, etc. Phase change material (PCM) switches are used for various applications such as radio-frequency (RF) applications. Advantages of PCM switches include their immunity to interference by electromagnetic radiation, relatively fast switching times, and ability to maintain their switching state (i.e., "On" or "Off") without consuming electrical power

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1E is a vertical cross-sectional view of a portion of the central region of the spreader layer, according to one or more embodiments.

FIG. 2B is a vertical cross-sectional view of an intermediate structure including the spreader layer, according to one or more embodiments.

FIG. 7 is a plan view (e.g., top-down view) of the spreader layer having a fourth alternative design, according to one or more embodiments

DETAILED DESCRIPTION

Figure 1A:
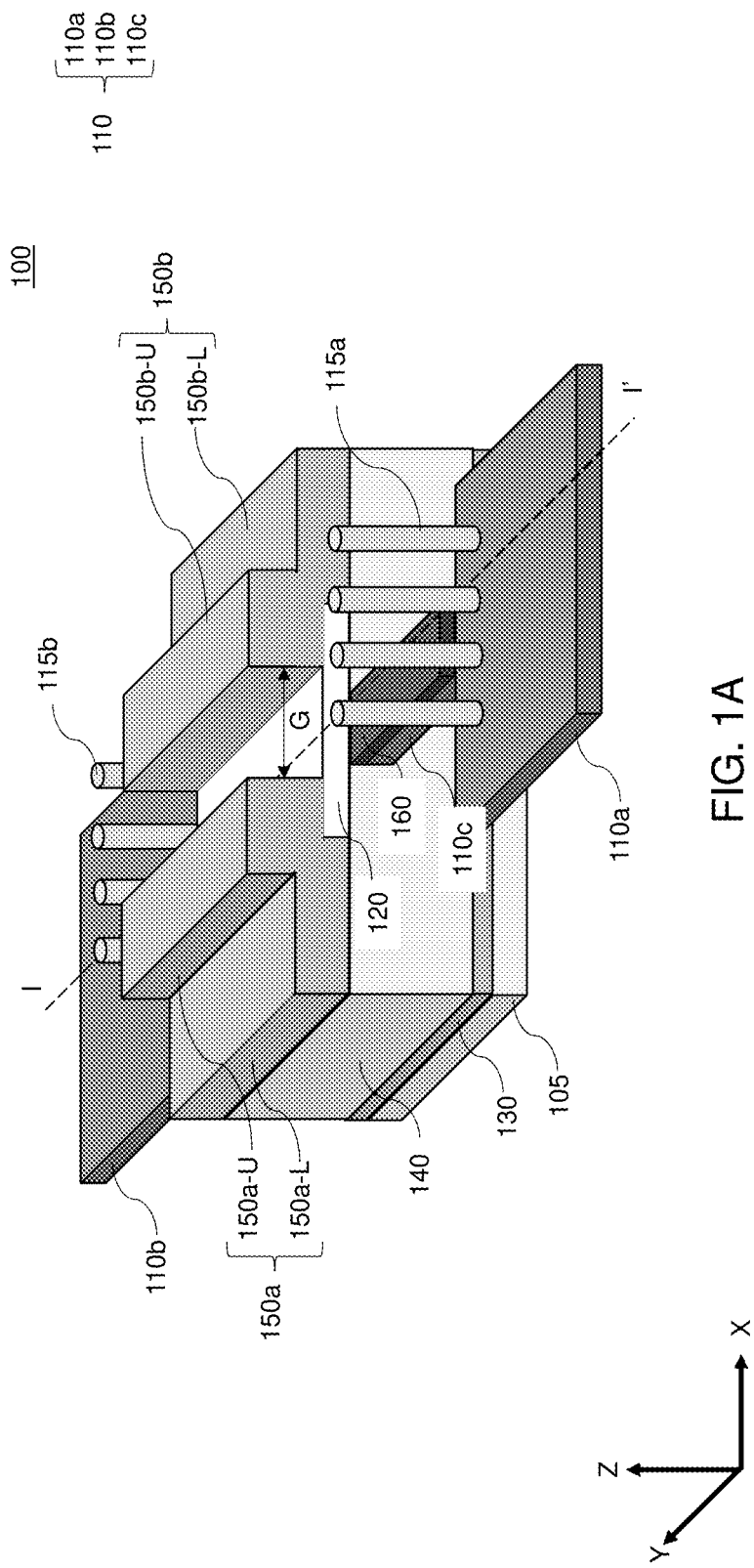
FIG. 1A is a perspective view of a switch (e.g., a radio frequency (RF) switch) having a basic configuration, according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

A switch having a phase change material (PCM) layer may be used for switching between components in an electronic device. In particular, a phase change material radio frequency switch (PCM-RFS) may be used as a radio frequency (RF) switch in RF applications. Such RF applications may include, for example, switching RF components of a communication device between various RF configurations. A PCM-RFS may provide a lower off capacitance ($C_{off}$) than a typical complementary metal oxide semiconductor (CMOS) switch. A switch having a low $C_{off}$ (and a low on resistance (R on)) may be beneficial in RF applications in order to avoid signal leakage at high frequency.

In a typical switch, a voltage differential across nodes of a heater layer may result in electrical current flowing through the heater layer. Such current flow may create joule heating in a heater layer and generate about 1000K local temperature to change a phase of an adjacent PCM layer from amorphous phase (switch open/signal blocked) to crystalline phase (switch closed/signal pass). Generally, the switch may preferably have good thermal confinement in order to reduce power consumption. In order to revert the PCM layer back to the amorphous phase (e.g., reset the switch to an open state), a quick heat dissipation may be used to bring the switch (e.g., the PCM layer) from 1000K to 500K within about 100 ns after current removal. Such heat dissipation (also referred to as quenching) may typically be achieved by connecting an end of the heater layer to a large metal pad (heat sink) and/or adding a large spreader layer (e.g., metal spreader) beneath the heater layer. A design of a spreader layer (which may "spread" heat in the PCM-RFS) may, therefore, play and important role in a quenching operation of the PCM layer.

In addition, a typical switch may include a non-uniform distribution of thermal resistivity along the heater layer. That is, a thermal resistivity at a center of the heater layer (center Rth) may be greater than a thermal resistivity at an edge of the heater layer (edge Rth). A temperature gradient (e.g., a large temperature gradient (e.g., center and edge in one or both the X and Y direction) may be bad for reliability of the typical switch.

At least one embodiment of the present disclosure may include a switch (e.g., semiconductor device) including a heater layer, a phase change material (PCM) layer on the heater layer, and a spreader layer on at least one of the heater layer or the PCM layer. The spreader layer may include a central region with a first thermal conductivity and an edge region with a second thermal conductivity less than the first thermal conductivity. In particular, the spreader layer may include a plurality of thermally conductive structures, and a density of the plurality of thermally conductive structures in the central region of the spreader layer may be greater than a density of the plurality of thermally conductive structures in the edge region of the spreader layer. The spreader layer may help to diminish a non-uniform distribution of thermal resistivity along the heater layer, wherein the non-uniform distribution of thermal resistivity may reduce reliability of the typical switch.

One or more embodiments may include a spreader design that leverages dummy metal pattern density modulation for PCM-RFS performance and reliability (e.g., low power, high reliability PCM-RFS). In particular, the embodiments may include an embedded electrical RF switch application that may be beneficial to 6G communication devices as well as devices that use millimeter wave technology.

The embodiments of the present disclosure may have several advantages over the typical switch. For example, embodiment switches may not change a size and/or shape of the heater layer, so that there may be no direct impact/trade-off to an electrical requirement of the heater layer. By maintaining the size and/or shape of the heater layer, there may also be no change in the critical signal path of the PCM-RFS. In addition, a modulation of pattern density in the spreader layer may tune a thermal profile of the spreader layer to have better uniformity resulting in improved reliability of the switch and avoiding an over-heating issue.

The spreader layer may include thermally conductive structures (e.g., floating pieces of high thermal conductivity material) and may be located underneath the heater and/or on the top of PCM layer. The PCM layer, heater layer, and other aspects of the switch (e.g., an oxide layer between the spreader layer and the PCM layer and or heater layer, an insulator layer between the heater layer and the PCM layer), may not be limited to any particular size (e.g., area, thickness) and/or shape.

The various aspects of the switch may also not be limited to any particular material. The heater layer may be connected to a heater contact (e.g., conductor) and may include a conductor with a thermal conductivity greater than about 175 W/m·K, a high melting point (e.g., greater than about 1500° C.) and a low Seebeck coefficient (e.g., less than about 20 μV/K). The heater layer may include tungsten, TiW or other metals or metal alloys.

The oxide layer may include an insulator with a thermal conductivity in a range from about 0 W/m·K to about 50 W/m·K (e.g., about 0 to 1.5 W/m·K). In particular, the oxide layer may include silicon dioxide (e.g., $SiO_2$), undoped silicate glass (USG) and/or other insulating materials.

The PCM layer may be formed on the insulator layer and on the signal contact, and may have a thermal conductivity in a range from about 2.5 W/m·K to about 10. The PCM layer may include GeTe, GeSeTe, hafnium-doped zinc oxide (HZO), and/or other PCM materials.

The insulator layer may be formed on the heater layer and have a low dielectric constant (e.g., k in a range from about 3 to 10) and high thermal conductivity (e.g., greater than about 100 W/m·K). In particular, the insulator layer may include silicon nitride (SiN), diamond-like carbon and/or other insulating materials.

The thermally conductive structures (e.g., floating pieces) of the spreader layer may have a thermal conductivity greater than about 100 W/m·K. The thermally conductive structures may include a compound such as SiC and/or metal such as copper, and/or other thermally conductive materials. The thermally conductive structures (e.g., floating pieces) may be located underneath the heater layer and/or on the top of PCM layer. Each of the thermally conductive structures may have a width (a) and length (b) that is not limited to any size and shape. A configuration (e.g., pattern) of the thermally conductive structures may be applicable in any direction (e.g., in the XY and YX plane).

In at least one embodiment, the thermally conductive structures may include a set of thermally conductive structures that extend from an edge region of the spreader layer across a central region of the spreader layer to an opposing edge region of the spreader layer. A spacing between the thermally conductive structures may increase in a direction away from the central region of the spreader layer and toward the edge region of the spreader layer and toward the opposing edge region of the spreader layer. Thus, an area density of the thermally conductive structures in the central region may be greater than an area density of the thermally conductive structures in the edge region.

In at least one embodiment, the thermally conductive structures may include a central set of thermally conductive structures in the central region of the spreader layer, and an edge set of thermally conductive structures in the edge region of the spreader layer. In the central set of thermally conductive structures and/or the edge set of thermally conductive structures, a width of the thermally conductive structures may decrease in a direction away from the central region of the spreader layer and toward the edge region of the spreader layer.

In at least one embodiment, the thermally conductive structures may include the central set of thermally conductive structures in the central region of the spreader layer, and the edge set of thermally conductive structures in the edge region of the spreader layer. An area density of the central set of thermally conductive structures may be greater than an area density of the edge set of thermally conductive structures. This may be accomplished, for example, by 1) providing a spacing between the thermally conductive structures in the central set of thermally conductive structures that may be less than a spacing between the thermally conductive structures in the edge set of thermally conductive structures, and/or 2) providing a width of the thermally conductive structures in the central set of thermally conductive structures may be greater than a width of the thermally conductive structures in the edge set of thermally conductive structures.

In at least one embodiment, the thermally conductive structures may include a set (e.g., a single set) of thermally conductive structures that extend from the edge region of the spreader layer across the central region of the spreader layer to the opposing edge region of the spreader layer. A width (a) of the thermally conductive structures in the x-direction may decrease in a direction away from the central region of the spreader layer and toward the edge region of the spreader layer and toward the opposing edge region of the spreader layer. A length (b) of the thermally conductive structures in the y-direction may decrease in a direction away from the central region of the spreader layer and toward the edge region of the spreader layer and toward the opposing edge region of the spreader layer. A spacing between the thermally conductive structures in both the x-direction and the y-direction may increase in a direction away from the central region of the spreader layer and toward the edge region of the spreader layer and toward the opposing edge region of the spreader layer. Thus, an area density of the thermally conductive structures in the central region may be greater than an area density of the thermally conductive structures in the edge region.

Figure 1B:
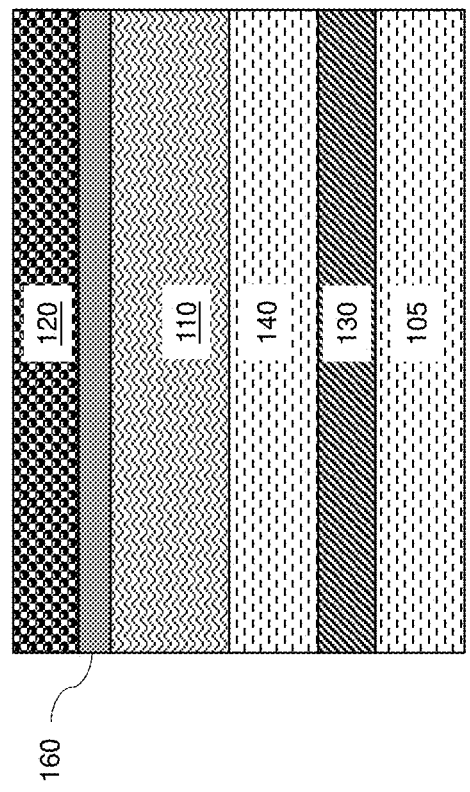
FIG. 1B is a vertical cross-sectional view (with the x-direction into the page) of a portion of the switch along the cross-section I-I', according to one or more embodiments.

FIG. 1A is a perspective view of a switch 100 (e.g., a radio frequency (RF) switch) having a basic configuration, according to one or more embodiments. FIG. 1B is a vertical cross-sectional view (with the x-direction into the page) of a portion of the switch 100 along the cross-section I-I', according to one or more embodiments. It should be noted that some elements of the switch 100 may be omitted from FIGS. 1A and 1B for ease of understanding.

The switch 100 (e.g., inline phase-change switch (IPCS)) may include a heater layer 110 (e.g., thin film resistor), a phase change material (PCM) layer 120 on the heater layer 110, and a spreader layer 130 formed below the heater layer 110. As illustrated in FIGS. 1A and 1B, an insulating layer 140 (thermally conductive insulating layer) may be located between the spreader layer 130 and the heater layer 110. The spreader layer 130 may alternatively or additionally be located on the PCM layer 120 (e.g., on an upper surface of the PCM layer 120).

The switch 100 may also include a positive signal contact 150a (e.g., positive signal pad or positive RF pad) on the PCM layer 120 and a negative signal contact 150b (e.g., negative signal pad or negative RF pad) on the PCM layer 120. In operation, a signal such as an RF signal may be transmitted from the positive signal contact 150a (e.g., RF input port) to the negative signal contact 150b (e.g., RF output port) through the PCM layer 120, in instances in which the PCM layer 120 is in a low resistive state (e.g., crystalline phase). The PCM layer 120 may not transmit the signal in instances in which the PCM layer 120 is in a high resistive state (e.g., amorphous phase).

As illustrated in FIGS. 1A and 1B, the spreader layer 130 may be located on an underlying substrate 105. The substrate 105 may include, for example, a semiconductor substrate (e.g., silicon, germanium, etc.), an oxide (e.g., silicon dioxide), a nitride (e.g., silicon nitride), etc. The substrate 105 may include, for example, one or more layers (e.g., a lower substrate layer and an upper substrate layer on the lower substrate layer).

The insulating layer 140 may be located on the spreader layer 130 and include an insulator with a thermal conductivity in a range from about 0 W/m·K to about 50 W/m·K (e.g., about 0 to 1.5 W/m·K). In particular, the insulating layer 140 may include an oxide layer such as silicon dioxide (e.g., $SiO_2$), undoped silicate glass (USG) and/or other suitable insulating materials.

The heater layer 110 may include a positive heater contact 110a (e.g., positive heater pad) and a negative heater contact 110b (e.g., negative heater pad). The positive heater contact 110a and negative heater contact 110b may be located on opposing sides of the switch 100 (e.g., in the y-direction). The positive heater contact 110a and negative heater contact 110b may be formed of substantially the same materials and have substantially the same size and shape. The positive heater contact 110a and negative heater contact 110b may be separated, for example, from the insulating layer 140. One or more metal vias 115a may contact a surface (e.g., upper surface) of the positive heater contact 110a. One or more metal vias 115b may contact a surface (e.g., upper surface) of the negative heater contact 110b. The metal vias 115a and metal vias 115b may be connected to a heat sink and help to dissipate heat from the heater contact 110a and the heater contact 110b, respectively. The metal vias 115a and metal vias 115b may be formed of copper, a copper alloy, or other suitable metal material.

The heater layer 110 may also include a heating portion 110c that extends from the positive heater contact 110a to the negative heater contact 110b. The heating portion 110c may be located in (e.g., embedded in) the insulating layer 140 and below the PCM layer 120. The heating portion 110c may be integrally formed with the positive heater contact 110a and negative heater contact 110b. The heating portion 110c may be formed of the same materials as the positive heater contact 110a and negative heater contact 110b. The heating portion 110c may have substantially the same thickness (e.g., in the z-direction) as the positive heater contact 110a and negative heater contact 110b. The heating portion 110c may have width (e.g., in the x-direction) that is less than a width of the positive heater contact 110a and negative heater contact 110b.

The heater layer 110 (e.g., each of the positive heater contact 110a, negative heater contact 110b and heating portion 110c) may include a conductor with a thermal conductivity greater than about 175 W/m·K, a high melting point (e.g., greater than about 1500° C.) and a low Seebeck coefficient (e.g., less than about 20 µV/K). The heater layer 110 may include tungsten, TiW or other metals or metal alloys, or other suitable conductive material.

The heating portion 110c may contact the PCM layer 120 through a thermal dielectric layer 160 (e.g., insulator). The thermal dielectric layer 160 may separate the heating portion 110c from the PCM layer 120. In particular, a bottom surface of the thermal dielectric layer 160 may directly contact the heating portion 110c, and an upper surface of the thermal dielectric layer 160 may directly contact the PCM layer 120. The thermal dielectric layer 160 may have a thickness that is less than a thickness of the heating portion 110c. The thermal dielectric layer 160 may have a width in the x-direction that is substantially the same as a width of the heating portion 110c. The thermal dielectric layer 160 may optionally have a width in the x-direction that is greater than a width of the heating portion 110c. The thermal dielectric layer 160 may also have a length in the y-direction that is substantially the same as a length of the heating portion 110c.

The thermal dielectric layer 160 may increase a distance from the heating portion 110c to the positive signal contact 150a, the negative signal contact 150b and the PCM layer 120. The thermal dielectric layer 160 may thereby help to reduce a parasitic capacitance coupling. A thermal path may be provided from the heating portion 110c to the PCM layer 120 by the thermal dielectric layer 160. The thermal dielectric layer 160 may be nonmetallic and electrically nonconductive and may include, for example, SiN, MN, diamond-like carbon, SiC and/or other suitable insulating materials. In particular, the thermal dielectric layer 160 may have a low dielectric constant (e.g., k in a range from about 3 to 10) and high thermal conductivity (e.g., greater than about 100 W/m·K).

In operation, a voltage differential may be created across the positive heater contact 110a and the negative heater contact 110b. For example, a positive heater contact 110a may be connected to a positive voltage and the negative heater contact 110b may be connected to a negative voltage. The resulting voltage drop between the positive heater contact 110a and negative heater contact 110b may generate joule heating in the heating portion 110c. In particular, a voltage pulse (e.g., input voltage or input bias) may create current for joule heating in the heating portion 110c and generate a local temperature of about 1000K or more. The heat generated by the joule heating in the heating portion 110c may heat the PCM layer 120 (e.g., through the thermal dielectric layer 160) so as to cause a phase change of the PCM layer 120 from crystalline phase to amorphous phase and thereby, change the resistivity of the PCM layer 120. Subsequent cooling (or quenching) may from amorphous phase to crystalline phase and thereby, to change the resistivity of the PCM layer 120 again.

The heating portion 110c and thermal dielectric layer 160 may be substantially embedded in the insulating layer 140. That is, the insulating layer 140 may contact both sidewalls of the heating portion 110c in the x-direction, and may contact a bottom surface of the heating portion 110c in the z-direction. The insulating layer 140 may also contact both sidewalls of the thermal dielectric layer 160 in the x-direction. An upper surface of the insulating layer 140 may be substantially coplanar with the upper surface of the thermal dielectric layer 160. The upper surface of the insulating layer 140 adjacent to the heating portion 110c may also contact a bottom surface of the PCM layer 120.

The PCM layer 120 may be located on or over the heating portion 110c and (optionally) on or over the insulating layer 140. The PCM layer 120 may have a length in the y-direction that is less than a length of the heating portion 110c, and substantially the same as a length of the insulating layer 140. The PCM layer 120 may have a width in the x-direction that is greater than a width of the heating portion 110c. In at least one embodiment, the width of the PCM layer 120 in the x-direction may be at least 50% greater than the width of the heating portion 110c. The PCM layer 120 may also have a thickness in the z-direction that is less than a thickness of the heater portion 110c. A central region of the PCM layer 120 may be located on the heating portion 110c (e.g., on the thermal dielectric layer 160). In particular, a center-point of the PCM layer 120 (in the x-direction and y-direction) may be substantially aligned with a center-point of the heating portion 110c. The PCM layer 120 may have a thermal conductivity in a range from about 2.5 W/m·K to about 10. The PCM layer 120 may include GeTe, GeSeTe (GST), hafnium-doped zinc oxide (HZO), and/or other suitable phase change materials.

The positive signal contact 150a may be located on the insulating layer 140 and on the PCM layer 120. The positive signal contact 150a may have a stepped configuration and include a lower positive signal contact portion 150a-L and an upper positive signal contact portion 150a-U. The lower positive signal contact portion 150a-L may be located on and contact an upper surface of the insulating layer 140 and may abut an first outer sidewall of the PCM layer 120. The upper positive signal contact portion 150a-U may be located on and contact an upper surface of the PCM layer 120. In at least one embodiment, the upper positive signal contact portion 150a-U may contact at least 20% of the upper surface of the PCM layer 120 in order to ensure an adequate contact with the PCM layer 120. The lower positive signal contact portion 150a-L may be integrally formed with the upper positive signal contact portion 150a-U. The lower positive signal contact portion 150a-L may be connected (e.g., seamlessly connected) to the upper positive signal contact portion 150a-U at the outer sidewall of the PCM layer 120.

The negative signal contact 150b may be located on an opposing side (in the x-direction) of the switch 100 from the positive signal contact 150a. The negative signal contact 150b may also be located on the insulating layer 140 and on the PCM layer 120. The negative signal contact 150b may also have a stepped configuration and may include a lower negative signal contact portion 150b-L and an upper negative signal contact portion 150b-U. The lower negative signal contact portion 150b-L may be located on and contact the upper surface of the insulating layer 140 and may abut a second outer sidewall of the PCM layer 120 that is opposite the first outer sidewall of the PCM layer 120. The upper negative signal contact portion 150b-U may also be located on and contact the upper surface of the PCM layer 120. In at least one embodiment, the upper negative signal contact portion 150b-U may contact at least 20% of the upper surface of the PCM layer 120 in order to ensure an adequate contact with the PCM layer 120. The lower negative signal contact portion 150b-L may be integrally formed with the upper negative signal contact portion 150b-U. The lower negative signal contact portion 150b-L may be connected (e.g., seamlessly connected) to the upper negative signal contact portion 150b-U at the outer sidewall of the PCM layer 120.

An inner sidewall of the upper positive signal contact portion 150a-U may face an inner sidewall of the upper negative signal contact portion 150b-U over the PCM layer 120. In at least one embodiment, a gap G between the inner sidewall of the upper positive signal contact portion 150a-U and the inner sidewall of the upper negative signal contact portion 150b-U may be greater than a width of the heating portion 110c in the x-direction. However, the gap G may be no greater than about 60% of the width of the PCM layer 120 in the x-direction.

The positive signal contact 150a may have a thickness that is substantially the same as a thickness of the negative signal contact 150b. The thickness of the positive signal contact 150a and negative signal contact 150b may be greater than a thickness of the PCM layer 120. The positive signal contact 150a and negative signal contact 150b may be formed of the same conductive material. In particular, the positive signal contact 150a and negative signal contact 150b may be formed of tungsten and/or other suitable conductive materials.

The spreader layer 130 may include, for example, a substrate (e.g., RF substrate) for the switch 100. The spreader layer 130 may be thermally conductive and help to dissipate heat in the heating portion 110c generated by joule heating. In this manner, the spreader layer 130 may be said to cool or quench the PCM layer 120. The spreader layer 130 may have an outer periphery that is substantially coextensive with an outer periphery of the insulating layer 140. In at least one embodiment, the spreader layer 130 may have a thickness in the z-direction that is less than the thickness of the heater layer 110. In at least one embodiment, the spreader layer 130 may have a thickness in the z-direction that is less than the thickness of the PCM layer 120. The spreader layer 130 may include a central region with a first thermal conductivity and an edge region with a second thermal conductivity different than (e.g., less than or greater than) the first thermal conductivity. In at least one embodiment, a thermal conductivity of the spreader layer 130 may gradually decrease (e.g., or gradually increase) from the first thermal conductivity in the central region of the spreader layer 130 to the second thermal conductivity in the edge region of the spreader layer 130.

As illustrated in FIGS. 1A and 1B, the spreader layer 130 may be formed in proximity to the PCM layer 120. Generally, a distance between the spreader layer 130 and the PCM layer 120 may be small enough for the spreader layer 130 to help dissipate heat in the PCM layer 120 and/or the heater layer 110. The phrase "in proximity to" as used in this context may be construed to mean that the spreader layer 130 may be formed within about 100 μm of the PCM layer 120. However, distances greater than 100 μm between the spreader layer 130 and the PCM layer 120 may be within the contemplated scope of this disclosure.

The spreader layer 130 may be designed such that a density of the metal in the metal pattern (e.g., the thermally conductive structures 135) may correspond to a thermal resistivity of the heating portion 110c. The design of the spreader layer 130 may help to provide a substantially uniform distribution of thermal resistivity (e.g., in the x-direction and/or in the y-direction) in the heater layer 110 (e.g., in the heating portion 110c), thereby improving a reliability of the switch 100 and avoiding an over-heating issue that may be common in a typical switch.

Figure 1C:
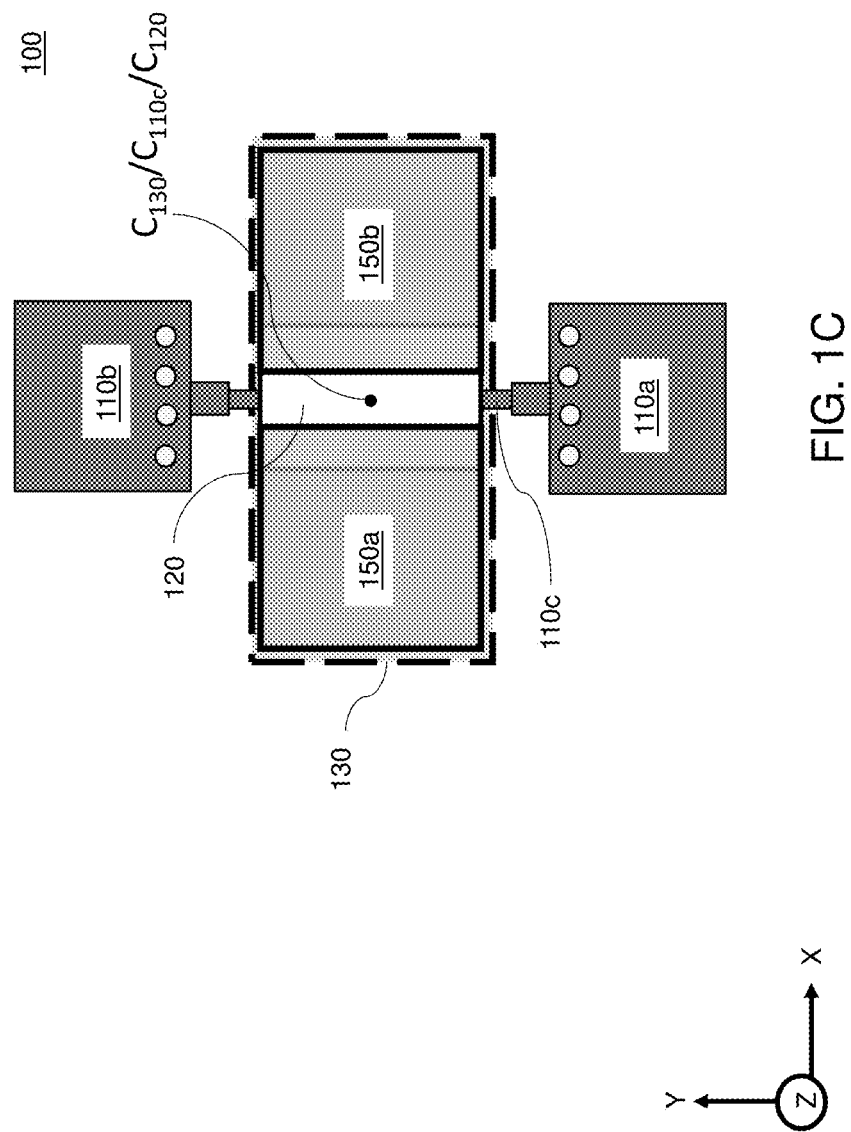
FIG. 1C is a plan view (e.g., top-down view) of the switch including the spreader layer, according to one or more embodiments.

FIG. 1C is a plan view (e.g., top-down view) of the switch 100 including the spreader layer 130, according to one or more embodiments. As illustrated in FIG. 1C, a length of the spreader layer 130 in the y-direction may be less than a length of the heating portion 110c. A width of the spreader layer 130 in the x-direction may be greater than a width of the positive heater contact 110a and greater than a width of the negative heater contact 110b. A center-point $C_{130}$ of the spreader layer 130 may be substantially aligned with a center-point $C_{110c}$ of the heating portion 110c and a center-point $C_{120}$ of the PCM layer 120. The central region of the spreader layer 130 may be substantially aligned with a central region of the heating portion 110c and with a central region of the PCM layer 120.

An operation of the switch 100 including the spreader layer 130 will now be briefly described. In operation, a setting voltage pulse may be applied to the heater layer 110 (e.g., across the positive heater contact 110a and negative heater contact 110b). The setting voltage pulse may have a duration of about 1 μs and increase a temperature of the PCM layer 120 to about a crystallization temperature (about 500K) of the PCM layer 120. As a result, the PCM layer 120 may be set to a crystalline phase having a low resistivity so that the switch 100 may be closed. With the switch 100 closed, a signal (e.g., RF signal) may be transmitted from the positive signal contact 150a to the negative signal contact 150b through the PCM layer 120.

A resetting voltage pulse may then be applied to the heater layer 110 (e.g., across the positive heater contact 110a and negative heater contact 110b). The resetting voltage pulse may include a greater voltage than the setting voltage pulse. The resetting voltage pulse may have a duration of about 150 ns and increase a temperature of the PCM layer 120 to about a melting temperature (about 1000K) of the PCM layer 120. A switching off of the heater layer 110 may cause a decrease in a temperature of the PCM layer 120 from about 1000K to about 500K within 100 ns. As a result, the PCM layer 120 may be reset to an amorphous phase having a high resistivity so that the switch 100 may be opened. With the switch 100 open, a signal (e.g., RF signal) may be blocked from transmission from the positive signal contact 150a to the negative signal contact 150b through the PCM layer 120.

In order to reset the PCM layer 120 to the amorphous phase, it may be beneficial to rapidly quench the melted PCM layer 120. The spreader layer 130 may dissipate heat from the PCM layer 120 and may, therefore, be influential in the quenching of the PCM layer 120. The spreader layer 130 may, therefore, may be influential in resetting of the PCM layer 120 to the amorphous phase.

Figure 1D:
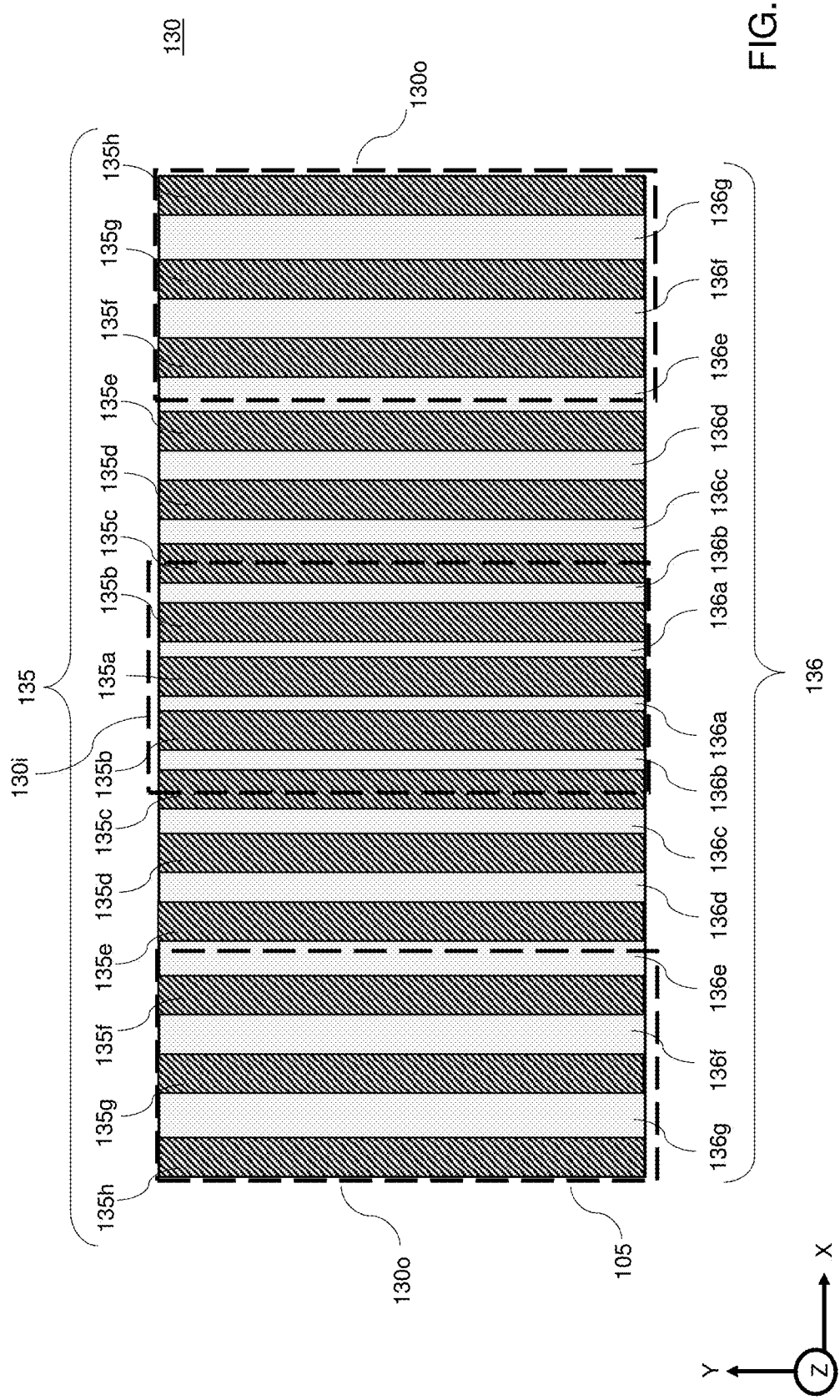
FIG. 1D is a plan view (e.g., top-down view) of the spreader layer, according to one or more embodiments.

FIG. 1D is a plan view (e.g., top-down view) of the spreader layer 130, according to one or more embodiments. As illustrated in FIG. 1D, the spreader layer 130 may include central region 130i and one or more edge regions 130o that may be located near an outermost edge of the spreader layer in the x-direction and/or y-direction. The central region 130i may include, for example, an innermost 20% to 40% of the spreader layer 130. Each of the edge regions 130o may include, for example, an outermost 20% to 40% of the spreader layer 130.

The spreader layer 130 may further include a thermally conductive pattern (e.g., metal pattern) including a plurality of thermally conductive structures 135a-135h (which may be referred to collectively as thermally conductive structures 135). Although the spreader layer 130 is depicted in FIG. 1D as including fifteen (15) thermally conductive structures 135 (i.e., 135a-135h), the spreader layer 130 may include any number of thermally conductive structures 135. The thermally conductive structures 135 may be electrically floating and, thus, may be referred to as "floating pieces". The thermally conductive structures 135 may have a thermal conductivity greater than about 100 W/m·K). The thermally conductive structures 135 may include a compound such as SiC and/or metal such as copper, and/or other thermally conductive materials (e.g., graphene, carbon nanotubes, etc.)

The thermally conductive structures 135 may have a width in the x-direction (e.g., a direction perpendicular to the longitudinal direction of the heating portion 110c in FIG. 1C) that is less than a length in the y-direction of the thermally conductive structures 135. As illustrated in FIG. 1D, each of the thermally conductive structures 135 may have substantially the same width and substantially the same length. However, in at least one embodiment, the width and/or length may vary. In particular, the width of the thermally conductive structures 135 may vary (e.g., gradually vary) in the x-direction. For example, a width of the thermally conductive structures 135 in the central region 130i may be greater than or less than a width of the thermally conductive structures 135 in the edge region 130o. Further, although the thermally conductive structures 135 are depicted as having a rectangular shape, the shape of the thermally conductive structures 135 are not limited to any particular shape.

The metal pattern (e.g., configuration) of the thermally conductive structures 135 may be applicable in any direction (e.g., in the XY and YX plane). Thus, although the thermally conductive structures 135 in FIG. 1D extend longitudinally in the y-direction and are arranged in the x-direction, the thermally conductive structures 135 may additionally or alternatively extend longitudinally in the x-direction and be arranged in the y-direction.

In at least one embodiment, the thermally conductive structures 135 may include metal layers or dummy metal located in or on the underlying substrate 105. The thermally conductive structures 135 may be separated by a plurality of spreader layer spaces 136a-136g (which may be referred to collectively as spreader layer spaces 136). That is, the spreader layer spaces 136 and the thermally conductive structures 135 may be alternatingly formed in the x-direction. A width of the spreader layer spaces 136a-136g may vary (e.g., gradually vary) in the x-direction. As a result, a density of the thermally conductive structures 135 in a central region 130i of the spreader layer 130 may be different than a density of the thermally conductive structures 135 in an edge region 130o of the spreader layer 130. Therefore, the central region 130i may have a first thermal conductivity and the edge region 130o may have a second thermal conductivity different than the first thermal conductivity.

In particular, as illustrated in FIG. 1D, the width of the spreader layer spaces 136a-136g may increase in a direction from the central region 130i of the spreader layer 130 to the edge region 130o of the spreader layer 130 and to the opposing edge region 130o on the opposite side of the spreader layer 130 in the x-direction. As a result, a density of the thermally conductive structures 135 in the central region 130i of the spreader layer 130 may be greater than a density of the thermally conductive structures 135 in the edge region 130o of the spreader layer 130 (e.g., in the x-direction). Therefore, the central region 130i may have a first thermal conductivity and the edge region 130o may have a second thermal conductivity less than the first thermal conductivity.

A rate of increase in the width in the x-direction of the spreader layer spaces 136a-136g is not necessarily limited. However, in at least one embodiment, a rate of increase may be in a range from 20% to 70%. Thus, for example, a width in the x-direction of the spreader layer space 136b may be 20% to 70% greater than a width of the spreader layer space 136a, a width in the x-direction of the spreader layer space 136c may be 20% to 70% greater than a width of the spreader layer space 136b and so on. As illustrated in FIG. 1D, the rate of increase may be substantially the same to the left side of thermally conductive structure 135a and to the right side of thermally conductive structure 135a. That is, a width of spreader layer space 136a may be substantially the same on both the left and right side of thermally conductive structure 135a, and so on. However, this is not necessarily the case.

FIG. 1E is a vertical cross-sectional view of a portion of the central region 130i of the spreader layer 130, according to one or more embodiments. The vertical cross-sectional view in FIG. 1E may be substantially representative of an entirety of the spreader layer 130. As illustrated in FIG. 1E, a thickness of the thermally conductive structures 135 (e.g., 135a, 135b) (e.g., dummy metal) may be less than a thickness of the underlying substrate 105. In at least one embodiment, the thickness of the thermally conductive structures 135 may be less than about 20% of the thickness of the substrate 105. In at least one embodiment, the thickness of the thermally conductive structures 135 may be in a range from 0.05 μm to about 1 μm. In addition, the thickness of the thermally conductive structures 135 may be substantially uniform so that an upper surface of the thermally conductive structures 135 may be substantially coplanar.

Figure 2A:
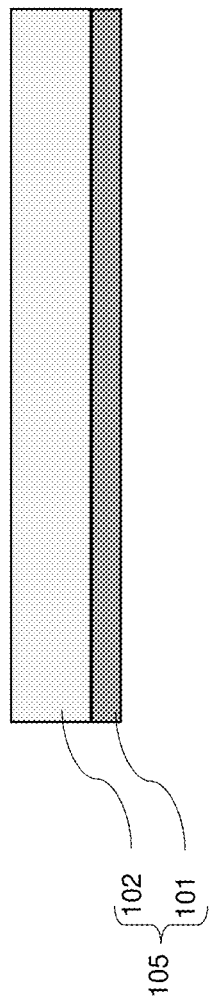
FIG. 2A is a vertical cross-sectional view of an intermediate structure including the substrate, according to one or more embodiments.

FIGS. 2A-2L are vertical cross-sectional views of intermediate structures in a method of forming a switch (e.g., switch 100), according to one or more embodiments. In particular, FIG. 2A is a vertical cross-sectional view of an intermediate structure including the substrate 105, according to one or more embodiments. As illustrated in FIG. 2A, the substrate 105 may include, for example, a lower substrate layer 101 and an upper substrate layer 102 on the lower substrate layer 101.

The lower substrate layer 101 may include, for example, silicon nitride or other suitable materials. A thickness of the lower substrate layer 101 is not necessarily limited. The lower substrate layer 101 may be deposited (e.g., on a carrier substrate) by thin film creation such as by chemical vapor deposition (CVD), plasma-enhanced CVD (PECVD), low pressure chemical vapor deposition (LPCVD), physical vapor deposition (PVD) (e.g., sputtering) or atomic layer deposition (ALD). The upper substrate layer 102 may include, for example, an oxide such as silicon dioxide or other suitable materials. A thickness of the upper substrate layer 102 is not necessarily limited. The upper substrate layer 102 may also be formed, for example, by thin film creation such as by chemical vapor deposition (CVD), plasma-enhanced CVD (PECVD), low pressure chemical vapor deposition (LPCVD), physical vapor deposition (PVD) (e.g., sputtering) or atomic layer deposition (ALD).

FIG. 2B is a vertical cross-sectional view of an intermediate structure including the spreader layer 130, according to one or more embodiments. The thermally conductive structures 135 may be formed on the surface of the substrate 105. To form the thermally conductive structures 135, a layer of thermally conductive material (e.g., a compound such as SiC and/or metal such as copper, and/or other thermally conductive materials) may be formed on the surface of the substrate 105. The layer of thermally conductive material may be deposited to have a thickness in a range from 0.05 μm to about 1 μm. The layer of thermally conductive material may be formed, for example, by thin film creation such as by chemical vapor deposition (CVD), plasma-enhanced CVD (PECVD), low pressure chemical vapor deposition (LPCVD), physical vapor deposition (PVD) (e.g., sputtering) or atomic layer deposition (ALD).

The layer of thermally conductive material may then be patterned to have a desired metal pattern, such as the metal pattern illustrated in FIG. 1D. The thermally conductive material may be patterned by etching. The etching may be performed, for example, by a photolithographic process that may include forming a patterned photoresist mask (not shown) on the layer of thermally conductive material so that an upper surface of the layer of thermally conductive material is exposed through openings in the photoresist mask. Then, the exposed upper surface of the layer of thermally conductive material may be etched (e.g., by wet etching, dry etching, etc.) through the openings in the photoresist mask. The photoresist mask may be subsequently removed by ashing, dissolving the photoresist mask or by consuming the photoresist mask during the etch process.

Figure 2C:
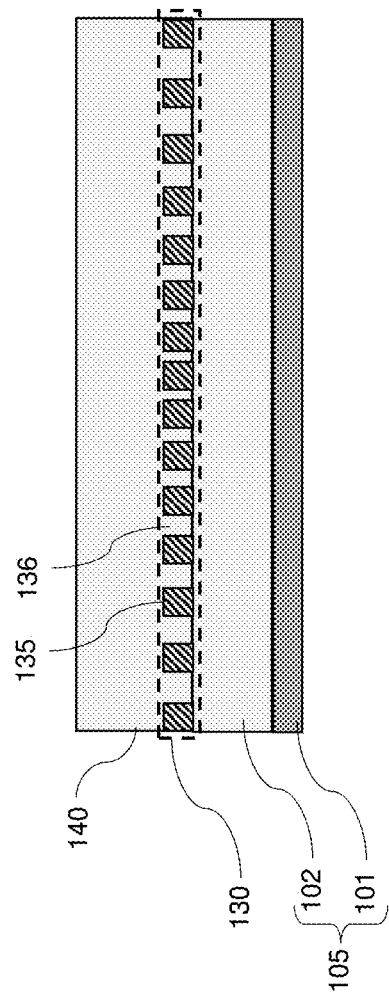
FIG. 2C is a vertical cross-sectional view of an intermediate structure including the insulating layer, according to one or more embodiments.

FIG. 2C is a vertical cross-sectional view of an intermediate structure including the insulating layer 140, according to one or more embodiments. The insulating layer 140 may have a structure (e.g., thickness, materials) similar to the structure as the upper substrate layer 102. As illustrated in FIG. 2c, the insulating layer 140 may be formed in the spreader layer spaces 136. In at least one embodiment, the insulating layer 140 may substantially fill the spreader layer spaces 136. A thickness of the insulating layer 140 measured from the surface of the substrate 105 may be equal to or greater than a thickness of the thermally conductive structures 135. In at least one embodiment, the thickness of the insulating layer 140 may be at least twice the thickness of the thermally conductive structures 135. The insulating layer 140 may be formed, for example, by thin film creation such as by chemical vapor deposition (CVD), plasma-enhanced CVD (PECVD), low pressure chemical vapor deposition (LPCVD), physical vapor deposition (PVD) (e.g., sputtering) or atomic layer deposition (ALD).

Figure 2D:
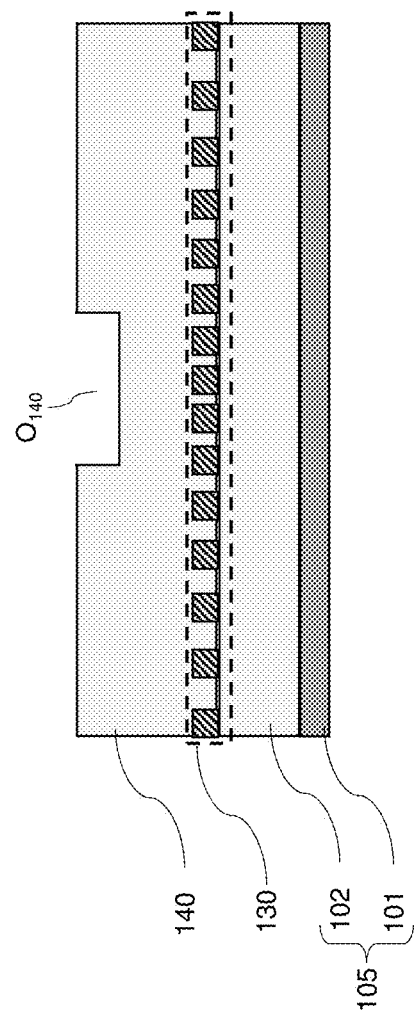
FIG. 2D is a vertical cross-sectional view of an intermediate structure including the opening in the insulating layer, according to one or more embodiments.

FIG. 2D is a vertical cross-sectional view of an intermediate structure including an opening $O_{140}$ in the insulating layer 140, according to one or more embodiments. The opening $O_{140}$ (e.g., heater trench) may be formed in the upper surface of the insulating layer 140. The opening $O_{140}$ may be formed in substantially the same location (e.g., a central portion of the insulating layer 140) and have substantially the same design as the subsequently-formed heating portion 110c. The opening $O_{140}$ may extend across an entire length of the insulating layer 140 in the y-direction. A depth of the opening $O_{140}$ in the z-direction may be less than a thickness of the insulating layer 140. In at least one embodiment, the depth of the opening $O_{140}$ may be substantially the same as the combined thickness of the subsequently-formed heating portion 110c and thermal dielectric layer 160.

The opening $O_{140}$ may be formed in the insulating layer 140 by etching. The etching may be performed, for example, by a photolithographic process. The photolithographic process may include forming a patterned photoresist mask (not shown) on the insulating layer 140 so that an upper surface of the insulating layer 140 is exposed through openings in the photoresist mask. Then, the exposed upper surface of the insulating layer 140 may be etched (e.g., by wet etching, dry etching, etc.) through the openings in the photoresist mask. The photoresist mask may be subsequently removed by ashing, dissolving the photoresist mask or by consuming the photoresist mask during the etch process.

Figure 2E:
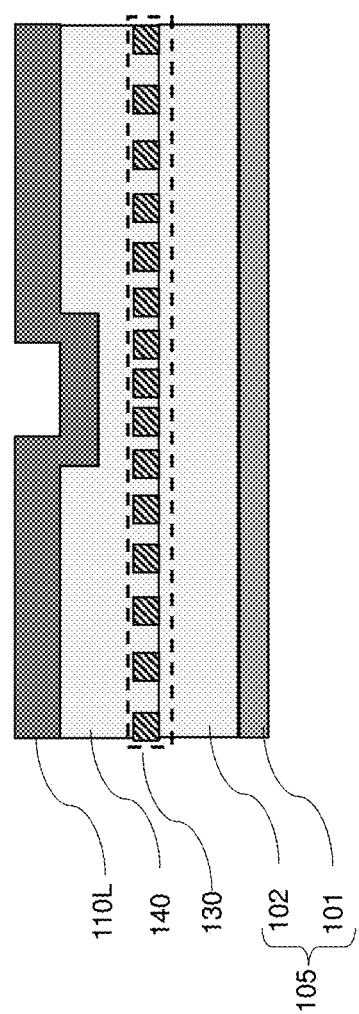
FIG. 2E is a vertical cross-sectional view of an intermediate structure including a layer of heater material, according to one or more embodiments.

FIG. 2E is a vertical cross-sectional view of an intermediate structure including a layer of heater material 110L, according to one or more embodiments. The layer of heater material 110L may be formed on a surface of the insulating layer 140. The layer of heater material 110L may be formed in the opening $O_{140}$ and substantially fill the opening $O_{140}$. That is, a thickness of the layer of heater material 110L may be at least greater than a depth of the opening $O_{140}$. The layer of heater material 110L may include, for example, tungsten, TiW or other metals or metal alloys, or other suitable conductive material. The layer of heater material 110L may be formed, for example, by thin film creation such as by chemical vapor deposition (CVD), plasma-enhanced CVD (PECVD), low pressure chemical vapor deposition (LPCVD), physical vapor deposition (PVD) (e.g., sputtering) or atomic layer deposition (ALD).

It should be noted that prior to forming the layer of heater material 110L, a heater barrier layer (not shown) may optionally be formed (e.g., conformally formed) on the insulating layer 140 and in the opening $O_{140}$. The heater barrier layer may include, for example, titanium nitride (TiN), tantalum nitride (TaN), and/or other suitable diffusion barrier materials. The heater barrier layer may also be formed by thin film creation such as by chemical vapor deposition (CVD), plasma-enhanced CVD (PECVD), low pressure chemical vapor deposition (LPCVD), physical vapor deposition (PVD) (e.g., sputtering) or atomic layer deposition (ALD).

Figure 2F:
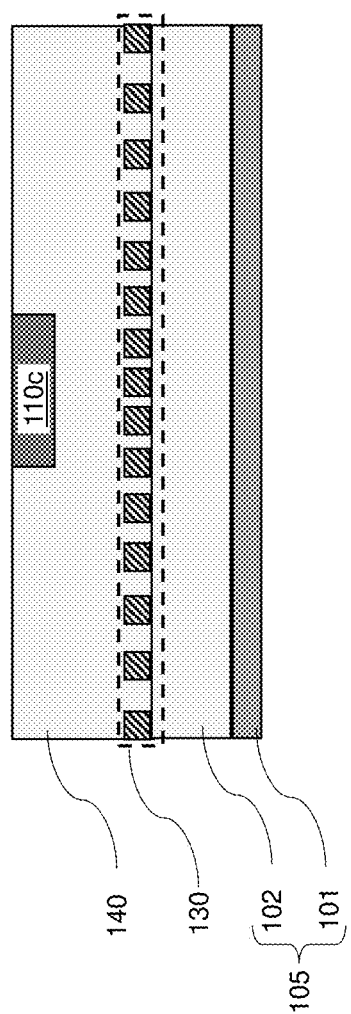
FIG. 2F is a vertical cross-sectional view of an intermediate structure including the heating portion of the heater layer, according to one or more embodiments.

FIG. 2F is a vertical cross-sectional view of an intermediate structure including the heating portion 110c of the heater layer 110, according to one or more embodiments. The layer of heater material 110L on the surface of the insulating layer 140 may removed so that the upper surface of the heating portion 110c is substantially co-planar with the upper surface of the insulating layer 140. The layer of heater material 110L may be removed, for example, by chemical mechanical polishing (CMP) and/or other suitable planarization methods. After the planarization, the upper surface of the heating portion 110c and/or the upper surface of the insulating layer 140 may be smoothed by buffing (e.g., touch-up polishing). It should be noted that the positive heater contact 110a and negative heater contact 110b may or may not be formed concurrently with the forming of the heating portion 110c.

Figure 2G:
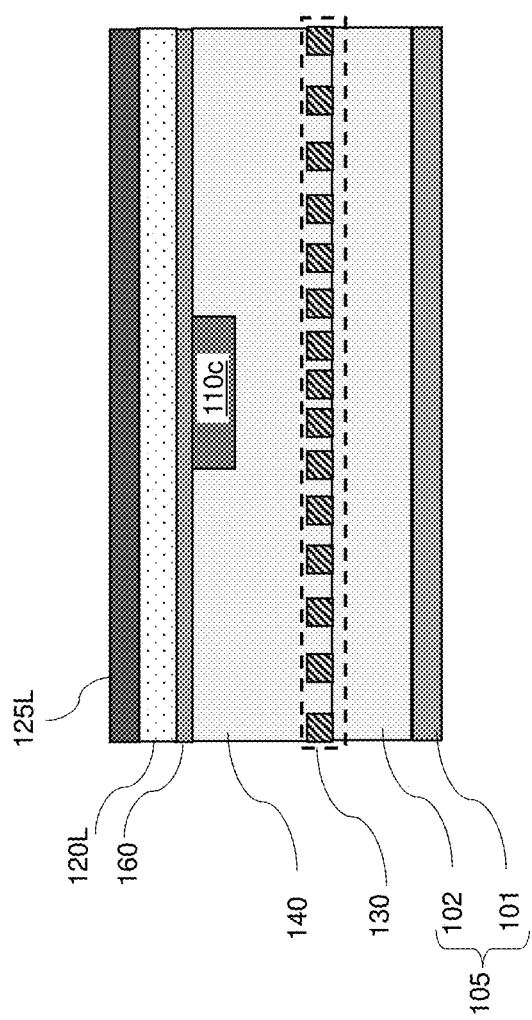
FIG. 2G is a vertical cross-sectional view of an intermediate structure including the thermal dielectric layer and a layer of PCM, according to one or more embodiments.

FIG. 2G is a vertical cross-sectional view of an intermediate structure including the thermal dielectric layer 160 and a layer of PCM 120L, according to one or more embodiments. To form the thermal dielectric layer 160, a layer of nonmetallic and electrically non-conductive material such as SiN, MN, diamond-like carbon, SiC, etc. may be formed on the upper surface of the insulating layer 140 and the upper surface of the heating portion 110c. The thermal dielectric layer 160 may be formed by thin film creation such as by chemical vapor deposition (CVD), plasma-enhanced CVD (PECVD), low pressure chemical vapor deposition (LPCVD), physical vapor deposition (PVD) (e.g., sputtering) or atomic layer deposition (ALD).

It should be noted that the thermal dielectric layer 160 may alternatively be formed in the heater opening $O_{140}$ on the heating portion 110c (e.g., see FIG. 2D and FIG. 2E). In that case, an upper surface of the thermal dielectric layer 160 may be planarized (e.g., by CMP) to be substantially coplanar with an upper surface of the insulating layer 140 as shown in FIG. 1A.

A layer of PCM 120L may then be formed on the thermal dielectric layer 160. The layer of PCM 120L may be formed, for example, by depositing GeTe, GeSeTe (GST), hafnium-doped zinc oxide (HZO), and/or other suitable phase change material, on the thermal dielectric layer 160. A layer of PCM barrier 125L (not shown in FIG. 1A) may then optionally be formed on the layer of PCM 120L. The layer of PCM barrier 125L may be formed, for example, by depositing a layer of titanium nitride (TiN), tantalum nitride (TaN), and/or other suitable diffusion barrier materials on the layer of PCM 120L. A thickness of the layer of PCM barrier 125L may be less than a thickness of the layer of PCM 120L. Each of the layer of PCM 120L and the layer of PCM barrier 125 may be individually formed by thin film creation such as by chemical vapor deposition (CVD), plasma-enhanced CVD (PECVD), low pressure chemical vapor deposition (LPCVD), physical vapor deposition (PVD) (e.g., sputtering) or atomic layer deposition (ALD).

Figure 2H:
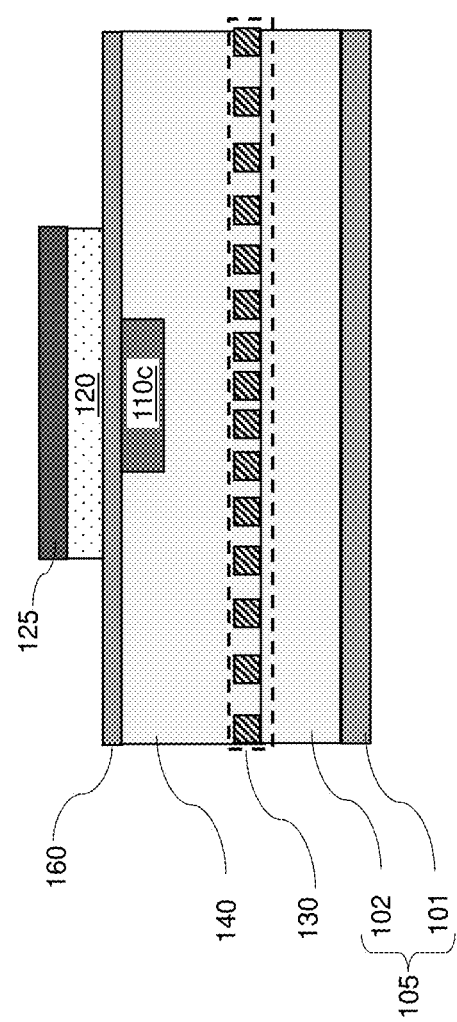
FIG. 2H is a vertical cross-sectional view of an intermediate structure including the PCM layer, according to one or more embodiments.

FIG. 2H is a vertical cross-sectional view of an intermediate structure including the PCM layer 120, according to one or more embodiments. The layer of PCM 120L and the layer of PCM barrier 125L may be etched to form (e.g., define) the PCM layer 120 and a PCM barrier layer 125 on the PCM layer 120, respectively. The etching may be performed, for example, by one or more photolithographic processes. The photolithographic processes may include forming a patterned photoresist mask (not shown) on the layer of PCM barrier 125L so that an upper surface of the layer of PCM barrier 125L is exposed through openings in the photoresist mask. Then, the exposed upper surface of the layer of PCM barrier 125L and the underlying layer of PCM 120L may be etched (e.g., by wet etching, dry etching, etc.) through the openings in the photoresist mask. The photoresist mask may be subsequently removed by ashing, dissolving the photoresist mask or by consuming the photoresist mask during the etch process.

Figure 2I:
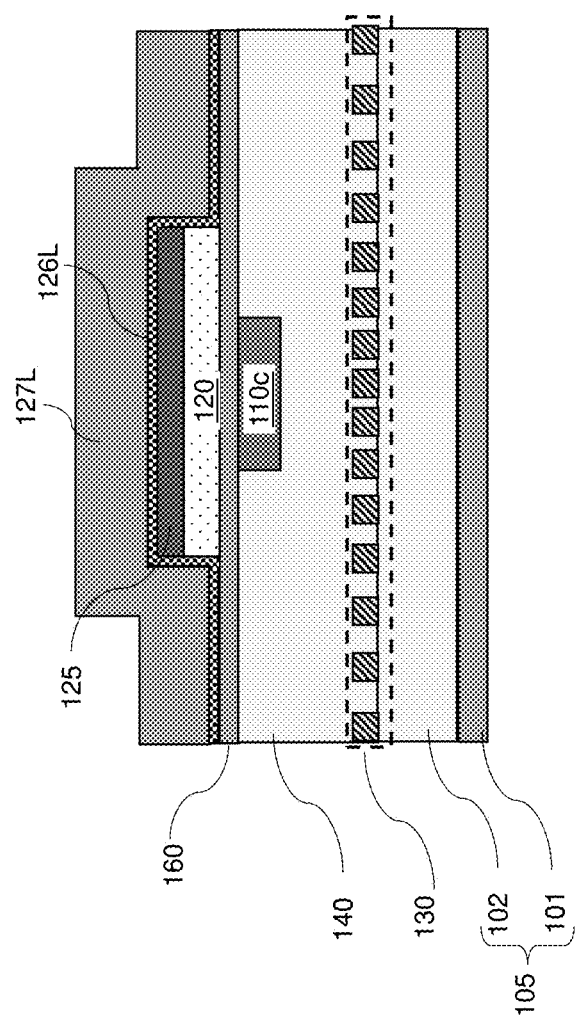
FIG. 2I is a vertical cross-sectional view of an intermediate structure including a layer of bottom spacer material and a layer of upper spacer material, according to one or more embodiments.

FIG. 2I is a vertical cross-sectional view of an intermediate structure including a layer of bottom spacer material 126L and a layer of upper spacer material 127L, according to one or more embodiments. The layer of bottom spacer material 126L and layer of upper spacer material 127L may optionally be used to form a PCM sidewall spacer that is not shown, for example, FIG. 1A.

The layer of bottom spacer material 126L (not shown in FIG. 1A) may optionally be formed (e.g., conformally formed) on the PCM layer 120 and PCM barrier layer 125. The layer of bottom spacer material 126L may be formed, for example, by depositing a layer of oxide (e.g., silicon dioxide) or other suitable spacer material on an upper surface of the PCM barrier layer 126, on a sidewall of the PCM barrier layer 126, on a sidewall of the PCM layer 120, and on the upper surface of the thermal dielectric layer 160. A thickness of the layer of bottom spacer material 126L may be less than a thickness of the PCM barrier layer 125. The layer of bottom spacer material 126L may be formed by thin film creation such as by chemical vapor deposition (CVD), plasma-enhanced CVD (PECVD), low pressure chemical vapor deposition (LPCVD), physical vapor deposition (PVD) (e.g., sputtering) or atomic layer deposition (ALD).

A layer of upper spacer material 127L may then optionally be formed (e.g., conformally formed) on the layer of bottom spacer material 126L. The layer of upper spacer material 127L may be formed, for example, by depositing a layer of nitride (e.g., silicon nitride) or other suitable spacer material on an upper surface of the layer of bottom spacer material 126L. A thickness of the layer of upper spacer material 127L may be greater than a thickness of the layer of bottom spacer material 126L. The layer of upper spacer material 127L may be formed by thin film creation such as by chemical vapor deposition (CVD), plasma-enhanced CVD (PECVD), low pressure chemical vapor deposition (LPCVD), physical vapor deposition (PVD) (e.g., sputtering) or atomic layer deposition (ALD).

Figure 2J:
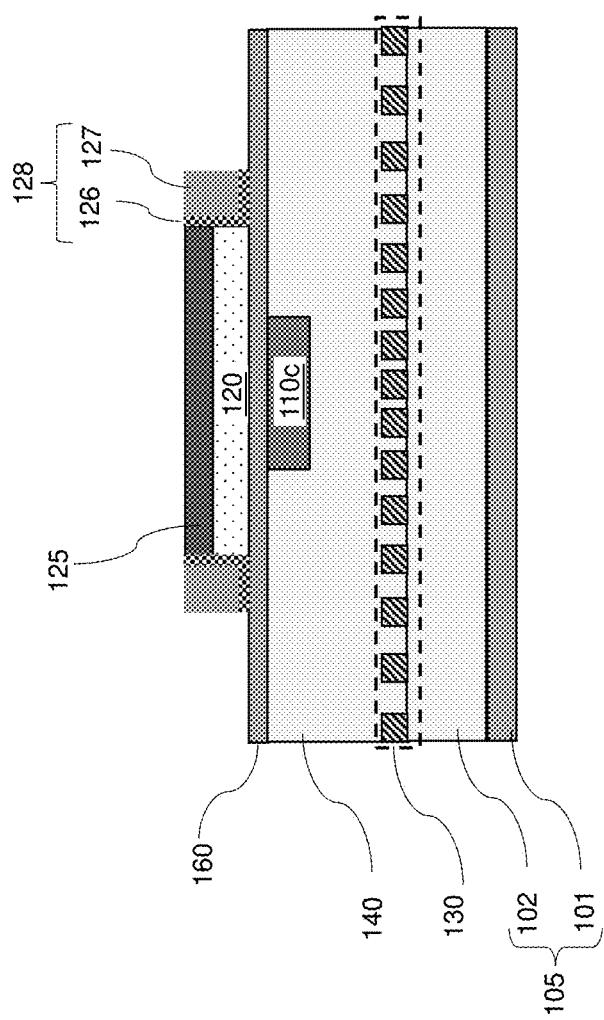
FIG. 2J is a vertical cross-sectional view of an intermediate structure including a bottom spacer and an upper spacer according to one or more embodiments.

FIG. 2J is a vertical cross-sectional view of an intermediate structure including a bottom spacer 126 and an upper spacer 127 according to one or more embodiments. The layer of bottom spacer material 126L and the layer of upper spacer material 127L may be etched to form (e.g., define) the bottom spacer 126 and the upper spacer 127 on the sidewall of the PCM layer 120 and the PCM barrier layer 125. The bottom spacer 126 and the upper spacer 127 may together form a PCM sidewall spacer 128.

The etching may be performed such that an upper surface of the bottom spacer 126 and an upper surface of the upper spacer 127 may be substantially coplanar with the upper surface of the PCM barrier layer 125. The etching may be performed, for example, by a photolithographic process. The photolithographic process may include forming a patterned photoresist mask (not shown) on the layer of upper spacer material 127L so that an upper surface of the layer of upper spacer material 127L is exposed through openings in the photoresist mask. Then, the exposed upper surface of the layer of upper spacer material 127L and the underlying layer of bottom spacer material 126L may be etched (e.g., by wet etching, dry etching, etc.) through the openings in the photoresist mask. The photoresist mask may be subsequently removed by ashing, dissolving the photoresist mask or by consuming the photoresist mask during the etch process.

Figure 2K:
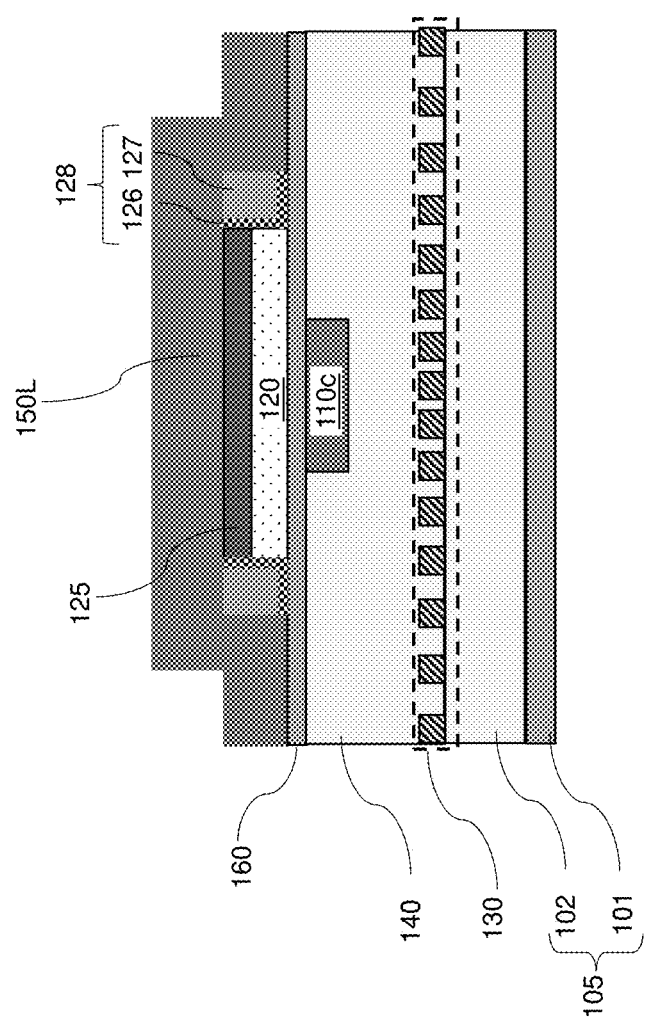
FIG. 2K is a vertical cross-sectional view of an intermediate structure including a layer of signal contact material, according to one or more embodiments.

FIG. 2K is a vertical cross-sectional view of an intermediate structure including a layer of signal contact material 150L, according to one or more embodiments. The layer of signal contact material 150L may be formed on the upper surface of the thermal dielectric layer 160, an upper surface of the PCM sidewall spacers 128, and the upper surface of the PCM barrier layer 125. The layer of signal contact material 150L may be formed, for example, by depositing a layer of tungsten and/or other suitable signal contact material on the upper surface of the thermal dielectric layer 160, the upper surface of the PCM sidewall spacers 128, and the upper surface of the PCM barrier layer 125. In at least one embodiment, a thickness of the layer of signal contact material 150L may be greater than a thickness of the PCM sidewall spacers 128 (e.g., a combined thickness of the PCM layer 120 and the PCM barrier layer 125). The layer of signal contact material 150L may be formed by thin film creation such as by chemical vapor deposition (CVD), plasma-enhanced CVD (PECVD), low pressure chemical vapor deposition (LPCVD), physical vapor deposition (PVD) (e.g., sputtering) or atomic layer deposition (ALD).

Figure 2L:
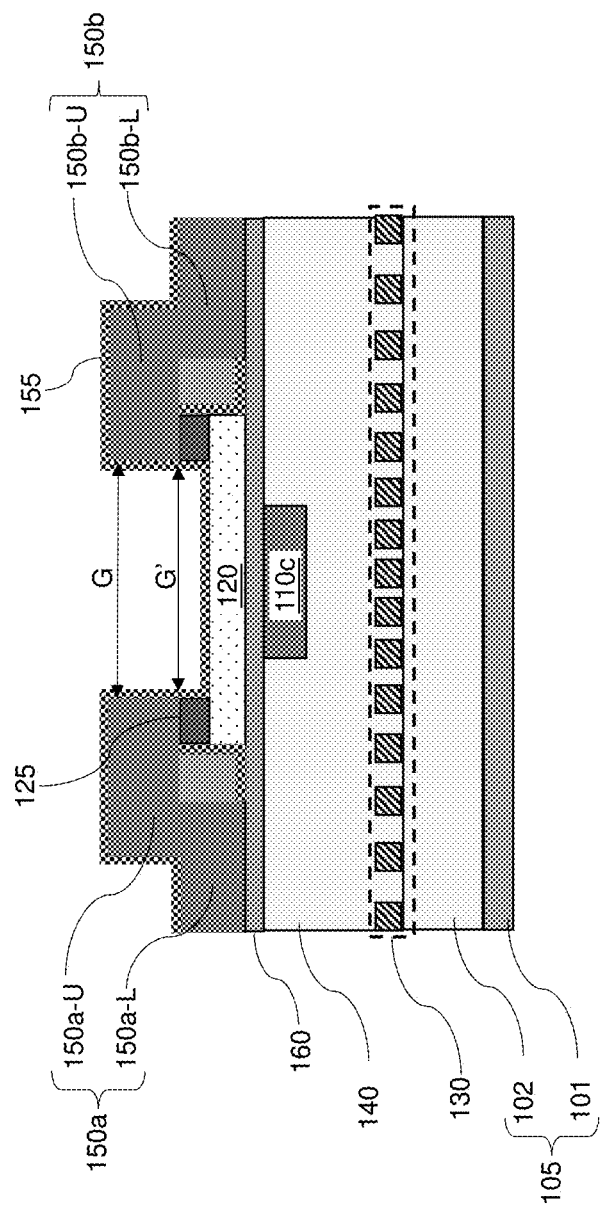
FIG. 2L is a vertical cross-sectional view of an intermediate structure including the positive signal contact and the negative signal contact, according to one or more embodiments.

FIG. 2L is a vertical cross-sectional view of an intermediate structure including the positive signal contact 150a and the negative signal contact 150b, according to one or more embodiments. As illustrated in FIG. 2K, a central portion of the layer of signal contact material 150L that is over the PCM layer 120 may be removed. A central portion of the PCM barrier layer 125 may be removed concurrently with (or subsequent to) the removal of the central portion of the layer of signal contact material 150L.

An etching may be performed in order to remove the central portion of the layer of signal contact material 150L and the central portion of the PCM barrier layer 125. The etching may be performed, for example, by one or more photolithographic processes. The photolithographic processes may include forming a patterned photoresist mask (not shown) on the layer of signal contact material 150L so that an upper surface of the layer of signal contact material 150L is exposed through openings in the photoresist mask. Then, the exposed upper surface of the layer of signal contact material 150L and the underlying PCM barrier layer 125 may be etched (e.g., by wet etching, dry etching, etc.) through the openings in the photoresist mask. The photoresist mask may be subsequently removed by ashing, dissolving the photoresist mask or by consuming the photoresist mask during the etch process.

The etching of the layer of signal contact material 150L may define the positive signal contact 150a (upper positive signal contact portion 150a-U and lower positive signal contact portion 150a-L) and negative signal contact 150b (upper negative signal contact portion 150b-U and lower negative signal contact portion 150b-L). The etching may also define the gap G between the inner sidewall of the upper positive signal contact portion 150a-U and the inner sidewall of the upper negative signal contact portion 150b-U. The etching of the PCM barrier layer 125 may also expose inner sidewalls of the PCM barrier layer 125 that may be substantially aligned with the inner sidewall of the upper positive signal contact portion 150a-U and the inner sidewall of the upper negative signal contact portion 150b-U.

A contact protective layer 155 (e.g., passivation layer) may optionally be formed on an upper surface of the positive signal contact 150a, an upper surface of the negative signal contact 150b, and the upper surface of the PCM layer 120. The contact protective layer 155 may also be formed on the inner sidewall of the upper positive signal contact portion 150a-U, the inner sidewall of the upper negative signal contact portion 150b-U, and the inner sidewalls of the PCM barrier layer 125. A gap G' (slightly less than the gap G) may be formed between the contact protective layer 155 in the gap G. The contact protective layer 155 may be formed, for example, by depositing a thin layer of protective material (e.g., SiN) on those surfaces and sidewalls. The contact protective layer 155 may be formed by thin film creation such as by chemical vapor deposition (CVD), plasma-enhanced CVD (PECVD), low pressure chemical vapor deposition (LPCVD), physical vapor deposition (PVD) (e.g., sputtering) or atomic layer deposition (ALD).

Figure 3:
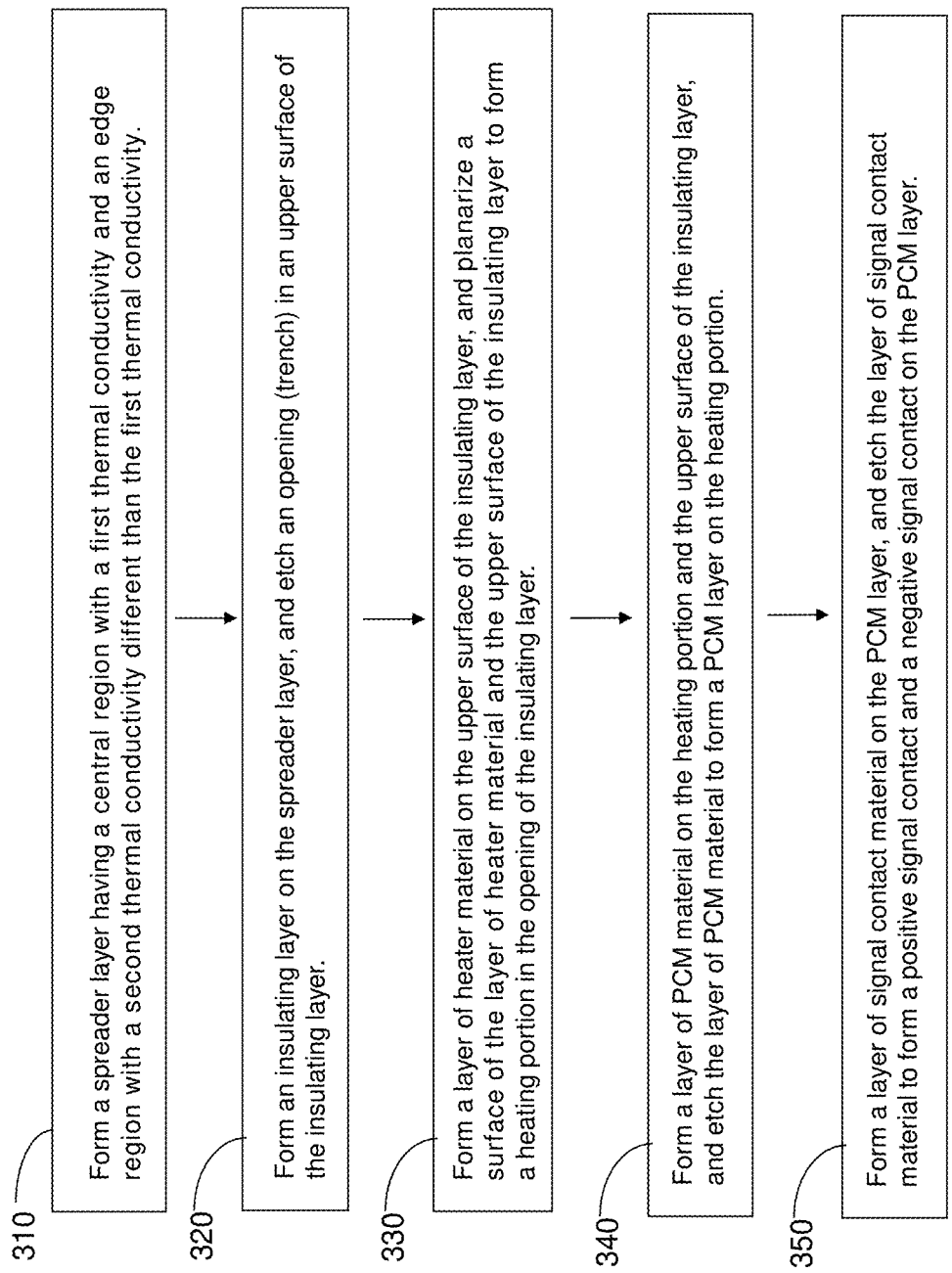
FIG. 3 is a flow chart illustrating the steps of an embodiment method of forming the switch, according to one or more embodiments.

FIG. 3 is a flow chart illustrating the steps of an embodiment method of forming the switch 100, according to one or more embodiments. The embodiment method may include step 310, form a spreader layer having a central region with a first thermal conductivity and an edge region with a second thermal conductivity different than (e.g., less than) the first thermal conductivity. The embodiment method may also include step 320, form an insulating layer on the spreader layer, and etch an opening (trench) in an upper surface of the insulating layer. The embodiment method may also include step 330, form a layer of heater material on the upper surface of the insulating layer, and planarize a surface of the layer of heater material and the upper surface of the insulating layer to form a heating portion in the opening of the insulating layer. The embodiment method may also include step 340, form a layer of PCM material on the heating portion and the upper surface of the insulating layer, and etch the layer of PCM material to form a PCM layer on the heating portion. The embodiment method may also include step 350, form a layer of signal contact material on the PCM layer, and etch the layer of signal contact material to form a positive signal contact and a negative signal contact on the PCM layer.

Figure 4:
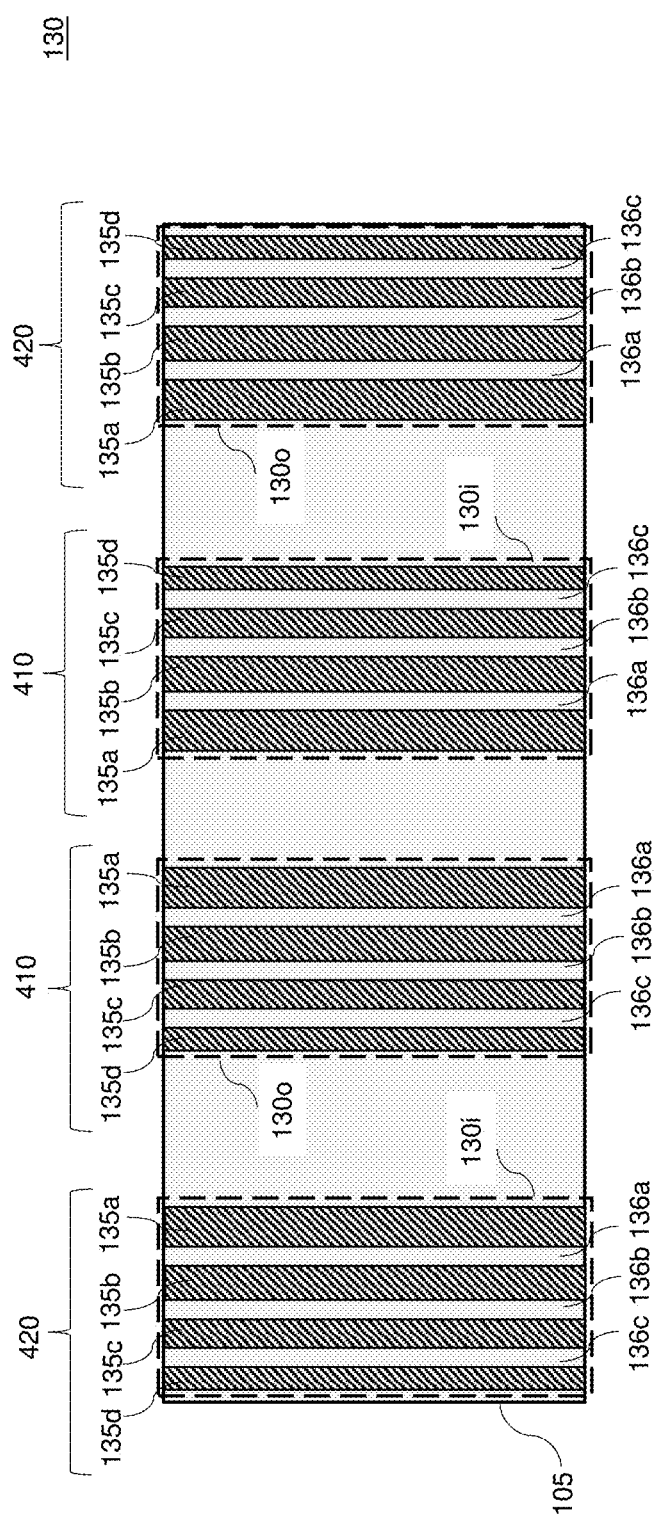
FIG. 4 is a plan view (e.g., top-down view) of the spreader layer having a first alternative design, according to one or more embodiments.

FIG. 4 is a plan view (e.g., top-down view) of the spreader layer 130 having a first alternative design, according to one or more embodiments. In the first alternative design, the spreader layer 130 may include a central set 410 of thermally conductive structures 135 (e.g., 135a, 135b, 135c, 135d) (e.g., floating pieces, dummy metal, etc.) in the central region 130i of the spreader layer 130, and an edge set 420 of thermally conductive structures 135 (e.g., 135a, 135b, 135c, 135d) in the edge region 130o of the spreader layer 130. In the central set 410 of the thermally conductive structures 135 and/or the edge set 420 of the thermally conductive structures 135, a width (in the x-direction) of the thermally conductive structures 135 may decrease in a direction away from the central region 130i of the spreader layer 130 and toward the edge region 130o of the spreader layer 130. The thermal conductivity of the spreader layer 130 may, therefore, decrease in a direction from the central region 130i to the edge region 130o.

In the central set 410 of the thermally conductive structures 135 and/or the edge set 420 of the thermally conductive structures 135, a width (in the x-direction) of each of the spreader layer spaces 136a, 136b and 136c may be substantially the same. Further, the arrangement of the thermally conductive structures 135 may be bidirectional so that the spreader layer 130 may include another central set 410 and another edge set 420 each having thermally conductive structures 135 that decrease in width toward the left side of the spreader layer 130 in FIG. 4.

A rate of decrease in the width in the x-direction of the thermally conductive structures 135 is not necessarily limited. However, in at least one embodiment, a rate of decrease may be in a range from 20% to 70%. That is, a width in the x-direction of the thermally conductive structure 135b may be 20% to 70% less than a width of the thermally conductive structure 135a, a width in the x-direction of the thermally conductive structure 135c may be 20% to 70% less than a width of the thermally conductive structure 135b and so on.

It should be noted that the width of the thermally conductive structures 135 in the central region 130i and/or the edge region 130o may alternatively decrease in a direction away from the central region 130i toward the edge region 130o. In that case, the thermal conductivity of the spreader layer 130 may increase in a direction from the central region 130i to the edge region 130o.

Figure 5:
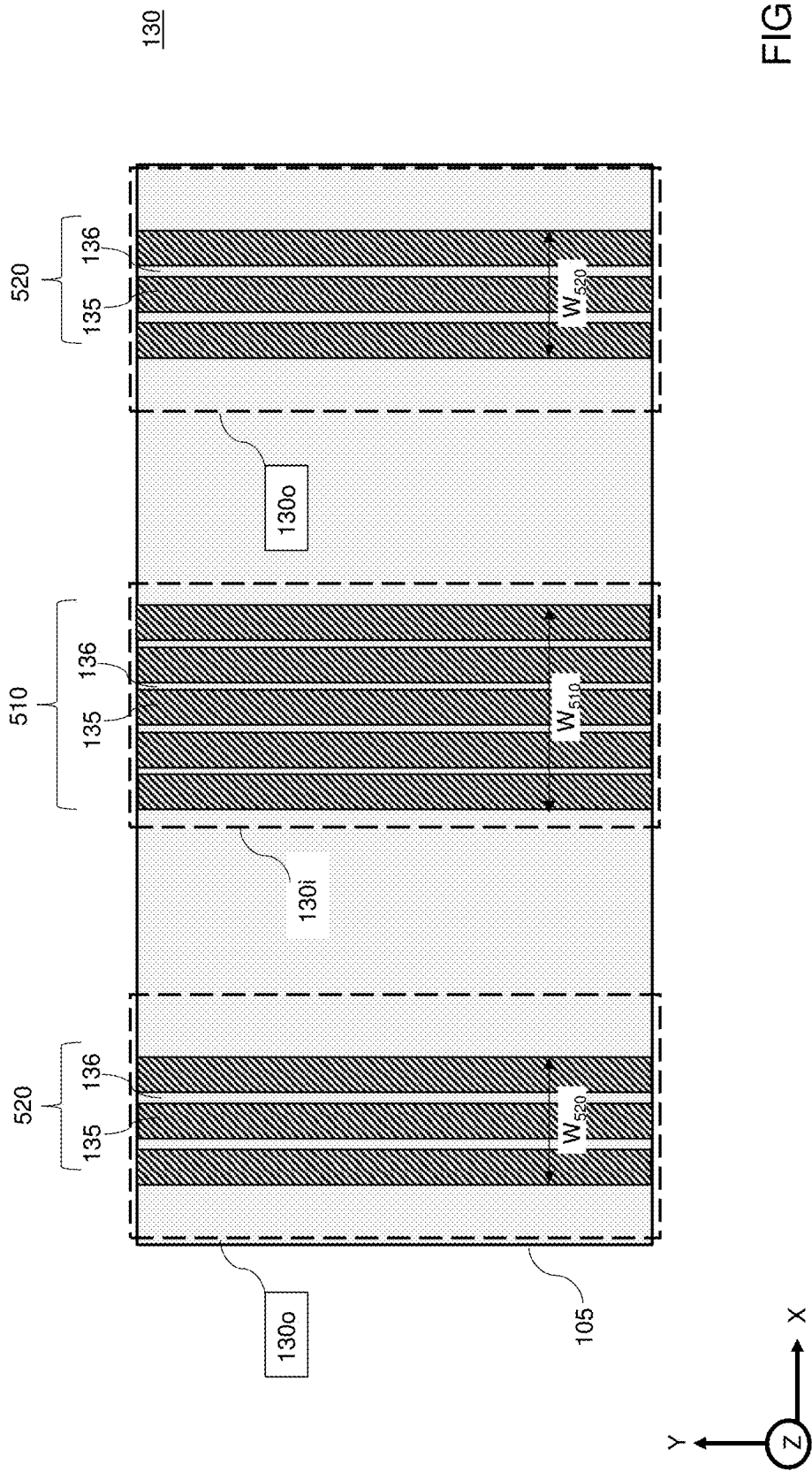
FIG. 5 is a plan view (e.g., top-down view) of the spreader layer having a second alternative design, according to one or more embodiments.

FIG. 5 is a plan view (e.g., top-down view) of the spreader layer 130 having a second alternative design, according to one or more embodiments. In the second alternative design, the spreader layer 130 may include a central set 510 of thermally conductive structures 135 (e.g., floating pieces, dummy metal, etc.) in the central region 130*i* of the spreader layer 130, and an edge set 520 of thermally conductive structures 135 in the edge region 130*o* of the spreader layer 130. A width of the thermally conductive structures 135 may be substantially the same in both the central set 510 and the edge set 520. Further, a spacing between the thermally conductive structures 135 may be substantially the same in both the central set 510 and/or the edge set 520. That is, in the central set 510 of the thermally conductive structures 135 and/or the edge set 520 of the thermally conductive structures 135, a width (in the x-direction) of each of the spreader layer spaces 136 may be substantially the same.

However, a number of thermally conductive structures 135 may be greater in the central set 510 than in the edge set 520, so that a total width W510 width of the central set 510 may be greater than a total width W520 of the edge set 520. Thus, an area density of the thermally conductive structures 135 in the central region 130*i* may be greater than an area density of thermally conductive structures 135 in the edge region 130*o*. Optionally, a width of the thermally conductive structures 135 or a spacing of the thermally conductive structures may be varied between the central set 510 and the edge set 520 in order to set the area density of the thermally conductive structures 135 in the central region 510 to be greater than an area density of the thermally conductive structures 135 in the edge region 520.

It should be noted that the number of thermally conductive structures 135 may alternatively be less in the central set 510 than in the edge set 520, so that a total width W510 width of the central set 510 may be less than a total width W520 of the edge set 520. In that case, the area density of the thermally conductive structures 135 in the central region 510 may be less than an area density of the thermally conductive structures 135 in the edge region 520.

Figure 6:
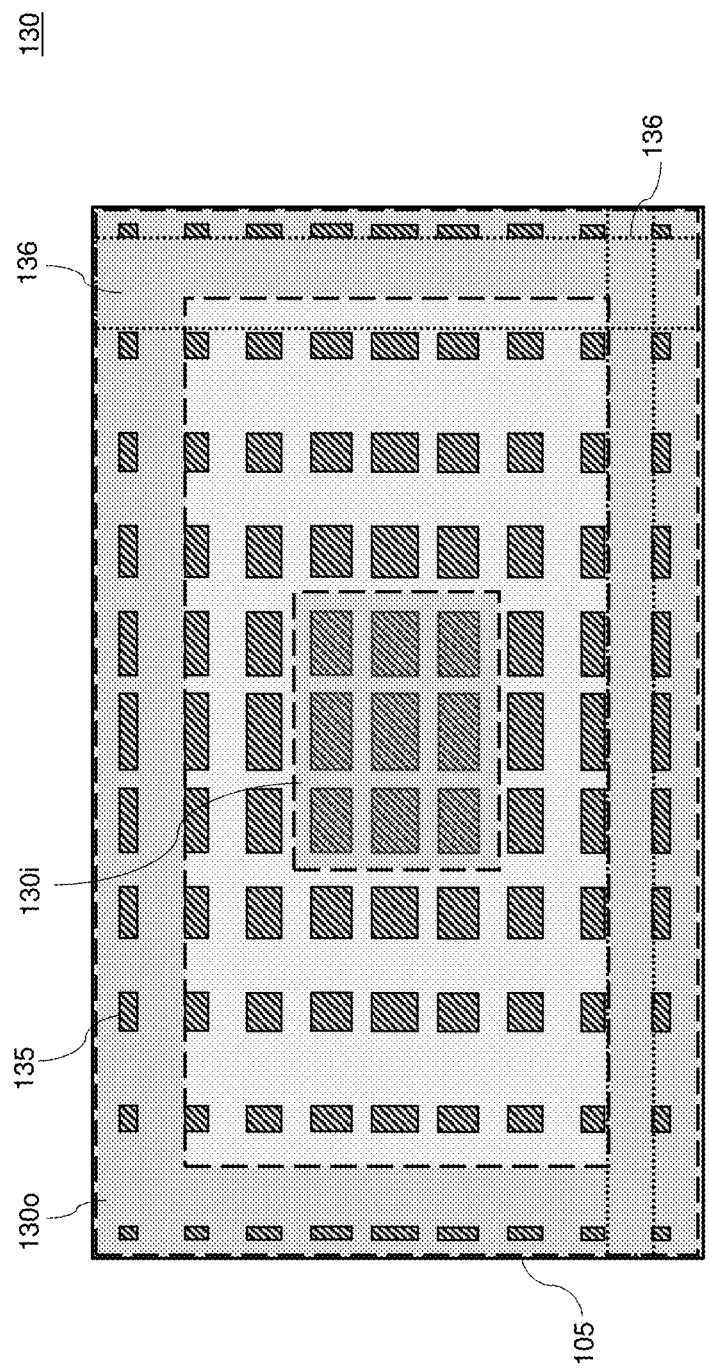
FIG. 6 is a plan view (e.g., top-down view) of the spreader layer having a third alternative design, according to one or more embodiments.

FIG. 6 is a plan view (e.g., top-down view) of the spreader layer 130 having a third alternative design, according to one or more embodiments. In the third alternative design, the spreader layer 130 may include a set (e.g., a single set) of thermally conductive structures 135 (e.g., floating pieces, dummy metal, etc.) that extend in both the x-direction and the y-direction from the central region 130*i* of the spreader layer 130 outward towards the edge region 130*o* of the spreader layer 130. The width of the thermally conductive structures 135 in the x-direction may decrease in a direction away from the central region 130*i* towards the edge region 130*o*. A length of the thermally conductive structures 135 in the y-direction may also decrease in a direction away from the central region 130*i* outward towards the edge region 130*o*. A rate of decrease in the width (x-direction) and length (y-direction) of the thermally conductive structures 135 is not necessarily limited. However, in at least one embodiment, the rate of decrease may be in a range from 20% to 70%.

Further, a spacing between the thermally conductive structures 135 in both the x-direction and the y-direction may increase in a direction away from the central region 130*i* towards the edge region 130*o*. That is, a width (x-direction) and/or length (y-direction) of each of the spreader layer spaces 136 may increase in a direction away from the central region 130*i* towards the edge region 130*o*. A rate of increase in the width (x-direction) and/or length (y-direction) of the spreader layer spaces 136 is not necessarily limited. However, in at least one embodiment, the rate of increase may be in a range from 20% to 70%.

Thus, in the third alternative, an area density of the thermally conductive structures 135 in the central region 130*i* may be greater than an area density of the thermally conductive structures 135 in the edge region 130*o* due to a decreasing width and/or length of the thermally conductive structures 135, and/or due to an increasing width and/or length of the spreader layer spaces 136.

It should be noted that alternatively a width and/or length of the thermally conductive structures 135 may increase and a width and/or length of the spreader layer spaces 136 may decrease in a direction from the central region 130*i* to the edge region 130*o*. In that case, an area density of the thermally conductive structures 135 in the central region 130*i* may be less than an area density of the thermally conductive structures 135 in the edge region 130*o* due to a increasing width and/or length of the thermally conductive structures 135, and/or due to an decreasing width and/or length of the spreader layer spaces 136.

FIG. 7 is a plan view (e.g., top-down view) of the spreader layer 130 having a fourth alternative design, according to one or more embodiments. The metal pattern in the fourth alternative design is basically the opposite of the basic design in FIG. 1D. In the fourth alternative design, the spreader layer 130 may include a set of thermally conductive structures 135 (e.g., floating pieces, dummy metal, etc.) that extend in the x-direction from the central region 130*i* of the spreader layer 130 outward towards the edge region 130*o* of the spreader layer 130. The width of the thermally conductive structures 135 in the x-direction and/or the length of the thermally conductive structures 135 in the y-direction may remain substantially the same (as shown in FIG. 7), or alternatively may increase in a direction away from the central region 130*i* towards the edge region 130*o*.

Further, a spacing between the thermally conductive structures 135 in the x-direction may decrease in a direction away from the central region 130*i* towards the edge region 130*o*. That is, as shown in FIG. 7, a width (x-direction) of each of the spreader layer spaces 136 may decrease in a direction away from the central region 130*i* towards the edge region 130*o*. A rate of decrease in the width (x-direction) of the spreader layer spaces 136 is not necessarily limited. However, in at least one embodiment, the rate of decrease may be in a range from 20% to 70%. Thus, in the fourth alternative, an area density of the thermally conductive structures 135 in the edge region 130*o* may be greater than an area density of the thermally conductive structures 135 in the central region 130*i* due to a decreasing width of the spreader layer spaces 136. This configuration of the spreader layer 130 may help to ameliorate an over-heating issue in a case where an edge region of the heating portion 110*c* (e.g., in the x-direction) may have a temperature greater than a temperature of a center region of the heating portion 110*c*.

Figure 8A:
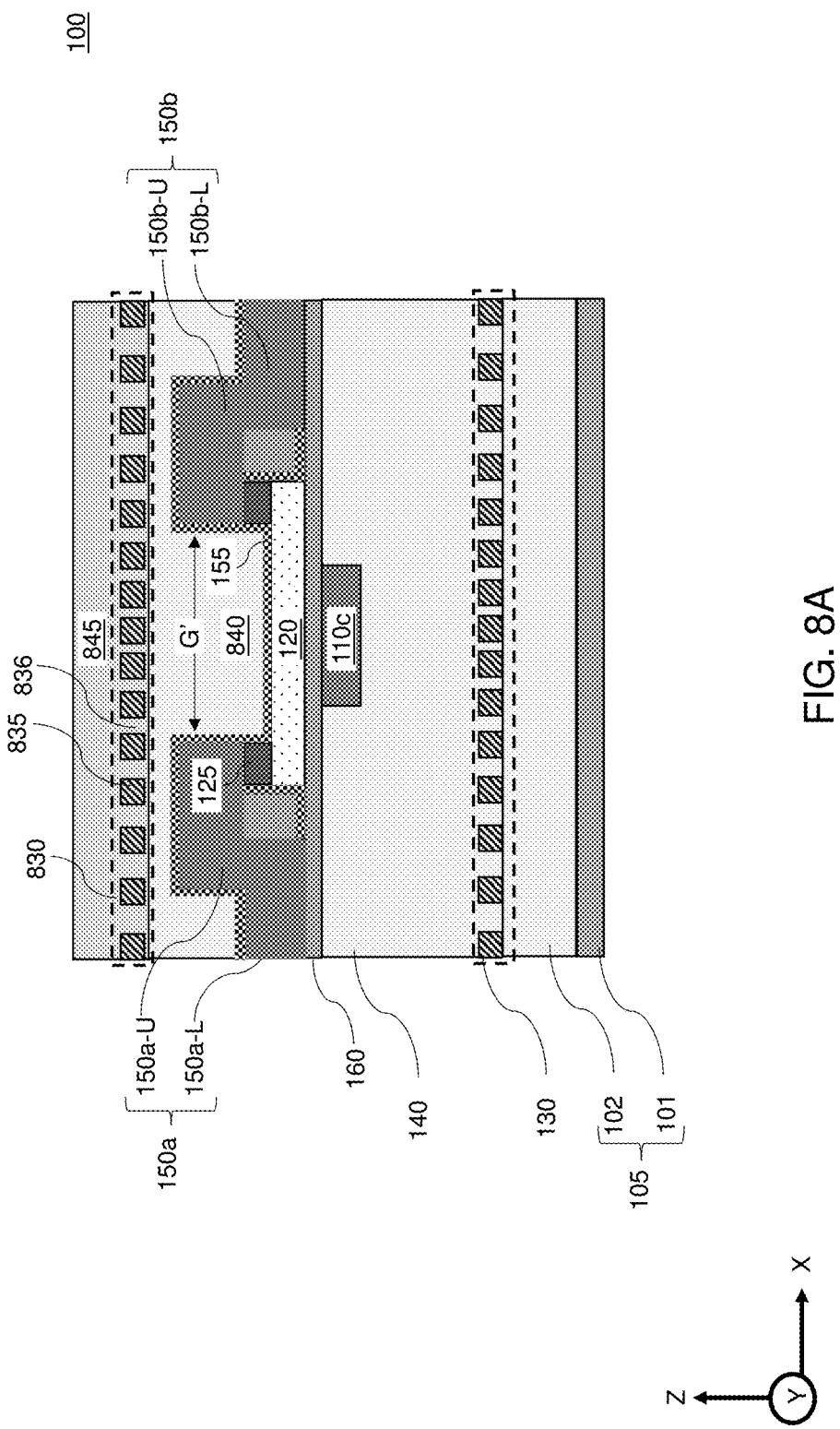
FIG. 8A is a vertical cross-sectional view (with the y-direction into the page) of the switch having an alternative configuration, according to one or more embodiments.
Figure 8B:
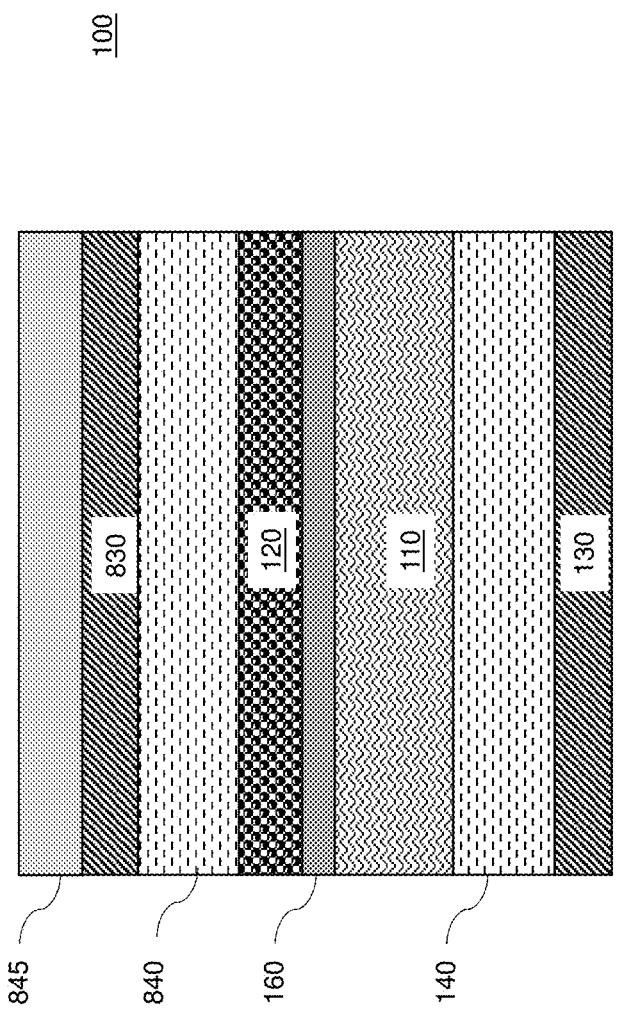
FIG. 8B is a vertical cross-sectional view (with the x-direction into the page) of a portion of the switch with the alternative configuration, according to one or more embodiments.

FIG. 8A is a vertical cross-sectional view (with the y-direction into the page) of the switch 100 having a first alternative configuration, according to one or more embodiments. FIG. 8B is a vertical cross-sectional view (with the x-direction into the page) of a portion of the switch 100 with the first alternative configuration, according to one or more embodiments. The first alternative configuration of the switch 100 in FIGS. 8A and 8B may have a structure and function that is substantially the same as a structure and function of the switch 100 in FIGS. 1A, 1B, and 2L. However, in the first alternative configuration, the switch 100 may include an upper insulating layer 840 (thermally conductive insulating layer; similar to the insulating layer 140) located on the PCM layer 120. In particular, the upper insulating layer 840 may be located (referring to FIG. 1A) on the PCM layer 120 within the gap G, or located (referring to FIG. 2L) on the contact protective layer 155 in the gap G'.

The upper insulating layer 840 may also be formed outside of the gap G (or gap G') and on the positive signal contact 150a and the negative signal contact 150b (e.g., on the contact protective layer 155). The upper insulating layer 840 may have a thickness in the gap G' that is substantially similar to a thickness of the insulating layer 140.

Further, an upper spreader layer 830 may be located on the upper insulating layer 840. The thickness of the upper insulating layer 840 may be such that a distance between the upper spreader layer 830 and the PCM layer 120 is substantially the same as a distance between the spreader layer 130 and the heating portion 110c.

The upper spreader layer 830 may include a plurality of thermally conductive structures 835 and a plurality of spreader layer spaces 836 between the plurality of thermally conductive structures 836. The upper spreader layer 830 may have a structure and function that is substantially the same as the spreader layer 130 described above with respect to the basic configuration in FIGS. 1A-1D and 2A-2L, or one of the alternative configurations in FIGS. 4-7. The upper spreader layer 830 may have a thickness that is substantially the same as a thickness of the spreader layer 130. A covering insulating layer 845 (e.g., oxide layer) may be located on the upper spreader layer 830 and may fill in the spreader layer spaces 836 between the thermally conductive structures 835 in the upper spreader layer 830.

It should be noted that while the first alternative configuration of the switch 100 in FIGS. 8A and 8B may include both the spreader layer 130 and the upper spreader layer 830, the spreader layer 130 may be omitted from the first alternative configuration of the switch 100. That is, the first alternative configuration of the switch 100 may include the upper spreader layer 830 and not include the spreader layer 130.

Figure 9A:
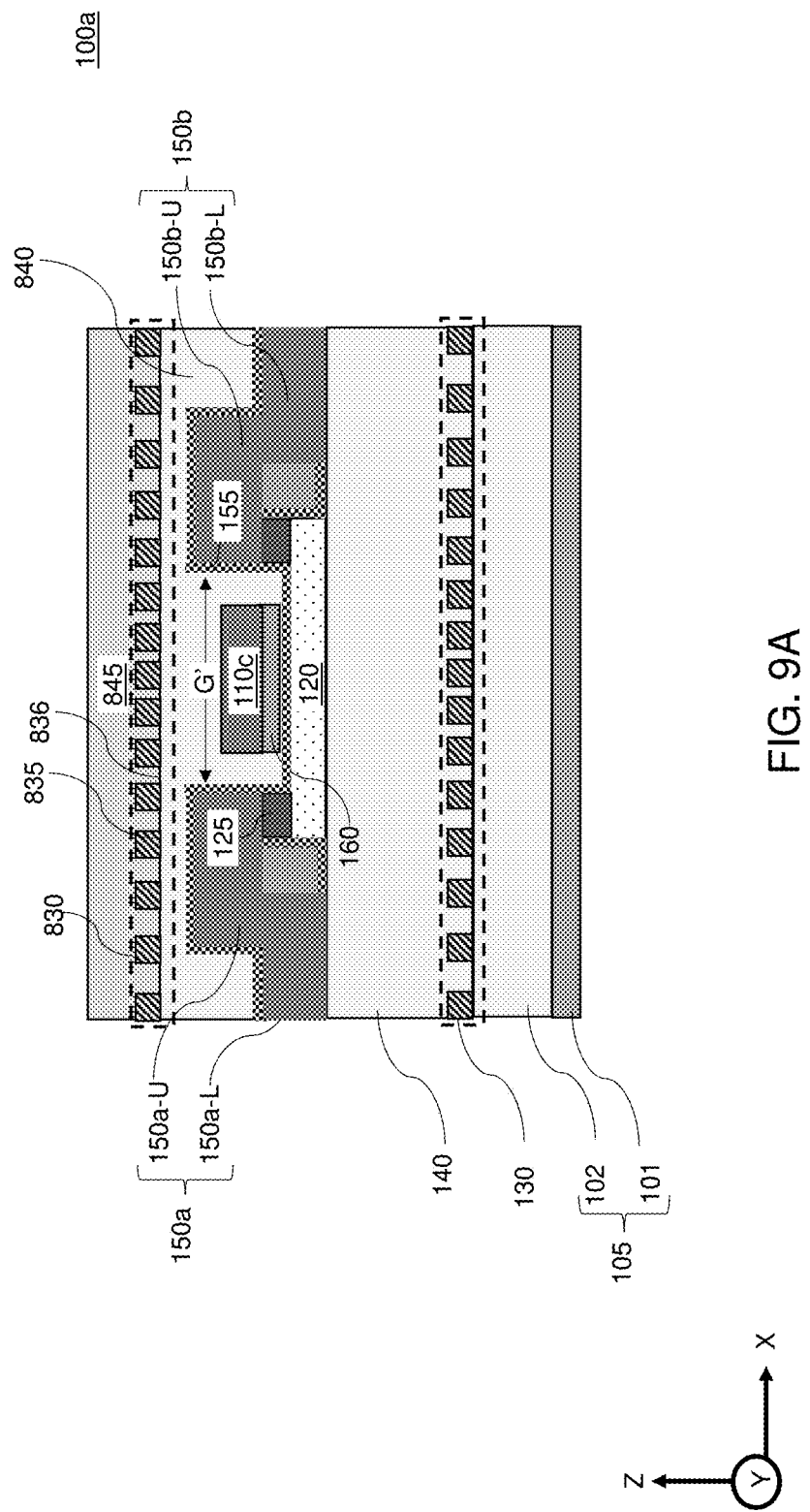
FIG. 9A is a vertical cross-sectional view (with the y-direction into the page) of the switch having an alternative configuration, according to one or more embodiments.
Figure 9B:
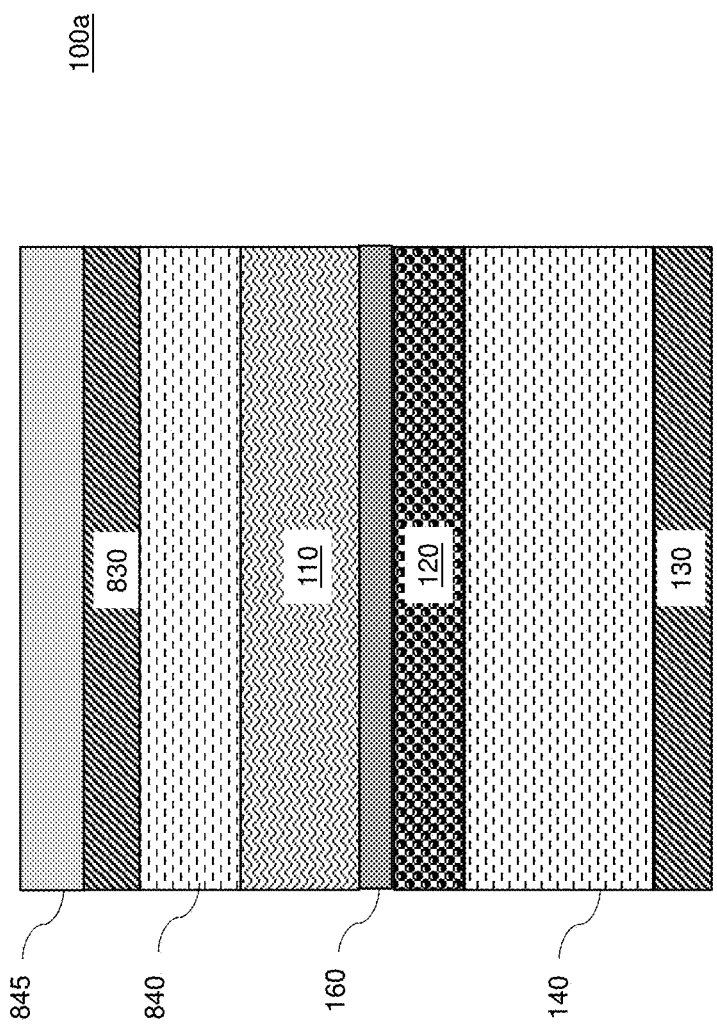
FIG. 9B is a vertical cross-sectional view (with the x-direction into the page) of a portion of the switch with the alternative configuration, according to one or more embodiments.

FIG. 9A is a vertical cross-sectional view (with the y-direction into the page) of the switch 100a having a second alternative configuration, according to one or more embodiments. FIG. 9B is a vertical cross-sectional view (with the x-direction into the page) of a portion of the switch 100a with the second alternative configuration, according to one or more embodiments. The second alternative configuration of the switch 100a in FIGS. 9A and 9B may have a structure and function that is substantially the same as a structure and function of the switch 100 in the first alternative configuration of FIGS. 8A and 8B. In particular, the switch 100a in the second alternative configuration may include both the spreader layer 130 and the upper spreader layer 830. However, instead of including the heating portion 110c and thermal dielectric layer 160 below the PCM layer 120 (e.g., between the spreader layer 130 and the PCM layer 120), in the second alternative configuration the heating portion 110c and thermal dielectric layer 160 may be located above the PCM layer 100 (e.g., between the upper spreader layer 830 and the PCM layer 120). That is, the heating portion 110c and the thermal dielectric layer 160 may be located on the PCM layer 120 between the positive signal contact 150a and the negative signal contact 150b.

In particular, the thermal dielectric layer 160 may be located on PCM layer 120 (e.g., on the contact protective layer 155) in the gap G' or in the gap G (see FIG. 1A). The heating portion 110c may be located on the thermal dielectric layer 160. The structure and function of the heating portion 110c and the thermal dielectric layer 160 may be substantially the same. However, a width of the thermal dielectric layer 160 in the second alternative configuration may be less than the width of the thermal dielectric layer 160 in the first alternative configuration of FIGS. 8A and 8B. The upper insulating layer 840 may be located on the upper surface of the heating portion 110c and on the sidewalls of the heating portion 110c and the sidewalls of the thermal dielectric layer 160.

The upper insulating layer 840 may have a thickness in the gap G' that is substantially similar to a thickness of the upper insulating layer 840 in the first alternative configuration in FIGS. 8A and 8B. In particular, the thickness of the upper insulating layer 840 may be coordinated with the thickness of the insulating layer 140 so that the distance between the upper spreader layer 830 and the heating portion 110c is substantially the same as the distance between the spreader layer 130 and the PCM layer 120.

It should be noted that while the second alternative configuration of the switch 100a in FIGS. 9A and 9B include both the spreader layer 130 and the upper spreader layer 830, either one of the spreader layer 130 and upper spreader layer 830 may be omitted from the second alternative configuration of the switch 100a. That is, the second alternative configuration of the switch 100a may include the upper spreader layer 830 and/or the spreader layer 130.

Figure 10:
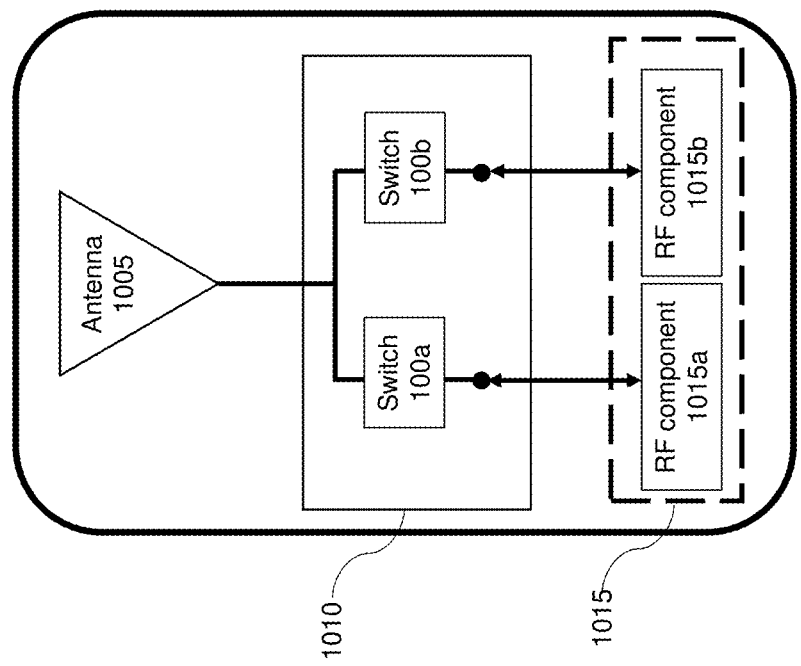
FIG. 10 illustrates an exemplary block diagram of a Radio Frequency (RF) transceiver system, in accordance with some embodiments of the present disclosure

FIG. 10 illustrates an exemplary block diagram of a Radio Frequency (RF) transceiver system 1000, in accordance with some embodiments of the present disclosure. The transceiver system 1000 may be included, for example, in a communication device such as a mobile phone (e.g., cellular phone). As illustrated in FIG. 10, the RF transceiver system 1000 may include one or more antennas 1005 such as a main antenna, diversity antenna, etc. The RF transceiver system 1000 may also include a switch module 1010 (e.g., RF switch module). The switch module 1010 may include one or more switches 100 (e.g., switch 100a, switch 100b). The RF transceiver system 1000 may also include an RF component section 1015. The RF component section 1015 may include a plurality of RF components 1015a, 1015b, etc. The RF components 1015a, 1015b may include, for example, a filter such as a receiver (Rx) filter 106 or low-pass filter (LPF), and/or other types of RF components. The RF components 1015a, 1015b may be connected to other components within the RF transceiver system 1000. For example, in at least one embodiment, one or more of the RF components 1015a, 1015b may include an Rx filter connected to a transceiver processor. The transceiver processor may include, for example, a low noise amplifier, an RF filter, a mixer, a demodulator, a digital-to-analog converter, an analog-to-digital converter, a modulator, etc.) In at least one embodiment, one or more of the RF components 1015a, 1015b may include an LPF connected to a power amplifier (PA) module which is connected to the transceiver processor.

In operation, the switch module 1010 may have a first configuration in which a PCM layer 120 of the switch 100a is in a crystalline phase so that the switch 100a is a closed state, and a PCM layer 120 of the switch 100b is in an amorphous phase so that the switch 100b is an open state. In the first configuration, the switch module 1010 may direct a signal (e.g., RF signal) from the antenna 1005 to the RF component 1015a (e.g., Rx filter).

The switch module 1010 may also have a second configuration in which the PCM layer 120 of the switch 100a is in a amorphous phase so that the switch 100a is a open state, and the PCM layer 120 of the switch 100b is in a crystalline phase so that the switch 100b is a closed state. In the second configuration, the switch module 1010 may direct a signal (e.g., RF signal) from the RF component 1015b (e.g., LPF) to the antenna 1005.

Referring to FIGS. 1A-10, a switch 100 may include a heater layer 110, a phase change material (PCM) layer 120 on the heater layer 110, and a spreader layer 130, 830 formed in proximity to the PCM layer 120. In some embodiments, the spreader layer 130, 830 may be formed at least one of below the PCM layer 120 or above the PCM layer 120. The spreader layer 130 may include a central region 130*i* with a first thermal conductivity and an edge region 130*o* with a second thermal conductivity different than the first thermal conductivity. The spreader layer 130, 830 may include a plurality of thermally conductive structures 135 having a thermal conductivity greater than 100 W/m·K, and a density of the plurality of thermally conductive structures 135 in the central region 130*i* of the spreader layer 130, 830 may be different than a density of the plurality of thermally conductive structures 135 in the edge region 130*o* of the spreader layer 130, 830. The density of the plurality of thermally conductive structures 135 in the central region 130*i* of the spreader layer 130, 830 may be greater than the density of the plurality of thermally conductive structures 135 in the edge region 130*o* of the spreader layer 130, 830. The density of the plurality of thermally conductive structures 135 in the central region 130*i* of the spreader layer 130, 830 may be less than the density of the plurality of thermally conductive structures 135 in the edge region 130*o* of the spreader layer 130, 830. A size of the plurality of thermally conductive structures 135 varies in a direction from the central region 130*i* to the edge region 130*o*. A combined width of the plurality of thermally conductive structures 135 in the central region 130*i* may be different than a combined width of the plurality of thermally conductive structures 135 in the edge region 130*o*. The plurality of thermally conductive structures 135 are separated by a plurality of spreader layer spaces 136. A size of the plurality of spreader layer spaces 136 may increase in a direction from the central region 130*i* to the edge region 130*o*. A size of the plurality of spreader layer spaces 136 may decrease in a direction from the central region 130*i* to the edge region 130*o*. The edge region 130*o* of the spreader layer 130, 830 may be located around a periphery of the spreader layer 130, 830 in a first direction from the central region 130*i* and in a second direction from the central region 130*i* perpendicular to the first direction, and at least one of a size of the plurality of thermally conductive structures 135 may decrease in the first direction from the central region 130*i* to the edge region 130*o*, a size of the plurality of thermally conductive structures 135 may decrease in the second direction from the central region 130*i* to the edge region 130*o*, a size of the plurality of spreader layer spaces 136 may increase in the first direction from the central region 130*i* to the edge region 130*o*, or a size of the plurality of spreader layer spaces 136 may increase in the second direction from the central region 130*i* to the edge region 130*o*. The spreader layer 130 may be below the PCM layer 120 and the switch 100 may further include a thermally conductive insulating layer 140 on the spreader layer 130, wherein the heating layer 110 is in the thermally conductive insulating layer 140. The spreader layer 830 may be above the PCM layer 120 and the switch 100 may further include a thermally conductive insulating layer 840 on the PCM layer 120, wherein the spreader layer 830 may be on the thermally insulating layer 840.

Referring to FIGS. 1A-10, a method of forming a switch 100 may include forming a heater layer 110, forming a phase change material (PCM) layer 120 on the heater layer 110, and forming a spreader layer 130, 830 in proximity to the PCM layer 120 and heater layer 110. In some embodiments, the spreader layer 130, 830 may be formed at least one of below the PCM layer 120 or above the PCM layer 120, such that the spreader layer 130, 830 includes a central region 130*i* with a first thermal conductivity and an edge region 130*o* with a second thermal conductivity different than the first thermal conductivity. The forming of the spreader layer 130, 830 may include forming the spreader layer 130, 830 to include a plurality of thermally conductive structures 135 having a thermal conductivity greater than 100 W/m·K, wherein a density of the plurality of thermally conductive structures 135 in the central region 130*i* of the spreader layer 130, 830 may be different than a density of the plurality of thermally conductive structures 135 in the edge region 130*o* of the spreader layer 130, 830. The forming of the spreader layer 130, 830 may include forming the plurality of thermally conductive structures 135 such that the density of the plurality of thermally conductive structures 135 in the central region 130*i* of the spreader layer 130, 830 may be greater than the density of the plurality of thermally conductive structures 135 in the edge region 130*o* of the spreader layer 130, 830. The forming of the spreader layer 130, 830 may include forming the plurality of thermally conductive structures 135 such that the density of the plurality of thermally conductive structures 135 in the central region 130*i* of the spreader layer 130, 830 may be less than the density of the plurality of thermally conductive structures 135 in the edge region 130*o* of the spreader layer 130, 830. The forming of the spreader layer 130, 830 may include forming the spreader layer 130, 830 to include a plurality of spreader layer spaces 136 located between the plurality of thermally conductive structures 135, and a size of the plurality of spreader layer spaces 136 may increase in a direction from the central region 130*i* to the edge region 130*o*. Forming of the spreader layer 130, 830 may include forming the plurality of thermally conductive structures 135 such that a size of the plurality of thermally conductive structures 135 may decrease in a direction from the central region 130*i* to the edge region 130*o*. The forming of the spreader layer 130, 830 may include forming the spreader layer 130, 830 such that the edge region 130*o* of the spreader layer 130, 830 may be located around a periphery of the spreader layer 130, 830 in a first direction from the central region 130*i* and in a second direction from the central region 130*i* perpendicular to the first direction, and at least one of a size of the plurality of thermally conductive structures 135 may decrease in the first direction from the central region 130*i* to the edge region 130*o*, a size of the plurality of thermally conductive structures 135 may decrease in the second direction from the central region 130*i* to the edge region 130*o*, a size of the plurality of spreader layer spaces 136 may increase in the first direction from the central region 130*i* to the edge region 130*o*, or a size of the plurality of spreader layer spaces 136 may increase in the second direction from the central region 130*i* to the edge region 130*o*.

Referring to FIGS. 1A-10, a radio frequency (RF) transceiver system 1000 for a communication device may include an antenna 1005, an RF component section 1015 including a plurality of RF components 1015*a*, and a switching module 1010 connected between the antenna 1005 and the RF component section 1015, including a plurality of switches 100 for switching a signal transmission path between the antenna 1005 and the plurality of RF components 1015*a*, each switch 100 of the plurality of switches 100 including a heater layer 110, a phase change material (PCM) layer 120 on the heater layer 110, and a spreader layer 130, 830 in proximity to the PCM layer 120 and heater layer 110. In some embodiments, the spreader layer 130, 830 may be formed at least one of below the PCM layer 120 or above the PCM layer 120 and including a central region 130$i$ with a first thermal conductivity and an edge region 130$o$ with a second thermal conductivity different than the first thermal conductivity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A switch, comprising:
  a heater layer;
  a phase change material (PCM) layer on the heater layer; and
  a spreader layer formed in proximity to the PCM layer, wherein the spreader layer comprises:
    a central region with a first thermal conductivity; and
    an edge region with a second thermal conductivity different than the first thermal conductivity.

2. The switch of claim 1, wherein the spreader layer comprises a plurality of thermally conductive structures having a thermal conductivity greater than 100 W/m·K, and a density of the plurality of thermally conductive structures in the central region of the spreader layer is different than a density of the plurality of thermally conductive structures in the edge region of the spreader layer.

3. The switch of claim 2, wherein the density of the plurality of thermally conductive structures in the central region of the spreader layer is greater than the density of the plurality of thermally conductive structures in the edge region of the spreader layer.

4. The switch of claim 2, wherein the density of the plurality of thermally conductive structures in the central region of the spreader layer is less than the density of the plurality of thermally conductive structures in the edge region of the spreader layer.

5. The switch of claim 2, wherein a size of the plurality of thermally conductive structures varies in a direction from the central region to the edge region.

6. The switch of claim 2, wherein a combined width of the plurality of thermally conductive structures in the central region is different than a combined width of the plurality of thermally conductive structures in the edge region.

7. The switch of claim 2, wherein the plurality of thermally conductive structures are separated by a plurality of spreader layer spaces.

8. The switch of claim 7, wherein a size of the plurality of spreader layer spaces increases in a direction from the central region to the edge region.

9. The switch of claim 7, wherein a size of the plurality of spreader layer spaces decreases in a direction from the central region to the edge region.

10. The switch of claim 7, wherein the edge region of the spreader layer is located around a periphery of the spreader layer in a first direction from the central region and in a second direction from the central region perpendicular to the first direction, and at least one of:
  a size of the plurality of thermally conductive structures decreases in the first direction from the central region to the edge region;
  a size of the plurality of thermally conductive structures decreases in the second direction from the central region to the edge region;
  a size of the plurality of spreader layer spaces increases in the first direction from the central region to the edge region; or
  a size of the plurality of spreader layer spaces increases in the second direction from the central region to the edge region.

11. The switch of claim 1, wherein the spreader layer is below the PCM layer and the switch further comprises:
  a thermally conductive insulating layer on the spreader layer, wherein the heater layer is in the thermally conductive insulating layer.

12. The switch of claim 1, wherein the spreader layer is above the PCM layer and the switch further comprises:
  a thermally conductive insulating layer on the PCM layer, wherein the spreader layer is on the thermally conductive insulating layer.

13. A method of forming a switch, comprising:
  forming a heater layer;
  forming a phase change material (PCM) layer on the heater layer; and
  forming a spreader layer in proximity to the PCM layer, wherein forming the spreader layer comprises:
    forming a central region of the spreader layer with a first thermal conductivity; and
    forming an edge region of the spreader layer with a second thermal conductivity different than the first thermal conductivity.

14. The method of claim 13, wherein the forming of the spreader layer comprises forming the spreader layer to include a plurality of thermally conductive structures having a thermal conductivity greater than 100 W/m·K, wherein a density of the plurality of thermally conductive structures in the central region of the spreader layer is different than a density of the plurality of thermally conductive structures in the edge region of the spreader layer.

15. The method of claim 14, wherein the forming of the spreader layer comprises forming the plurality of thermally conductive structures such that the density of the plurality of thermally conductive structures in the central region of the spreader layer is greater than the density of the plurality of thermally conductive structures in the edge region of the spreader layer.

16. The method of claim 14, wherein the forming of the spreader layer comprises forming the plurality of thermally conductive structures such that the density of the plurality of thermally conductive structures in the central region of the spreader layer is less than the density of the plurality of thermally conductive structures in the edge region of the spreader layer.

17. The method of claim 14, wherein the forming of the spreader layer comprises forming the spreader layer to include a plurality of spreader layer spaces located between the plurality of thermally conductive structures, and a size of the plurality of spreader layer spaces increases in a direction from the central region to the edge region.

18. The method of claim 14, wherein the forming of the spreader layer comprises forming the plurality of thermally conductive structures such that a size of the plurality of thermally conductive structures decreases in a direction from the central region to the edge region.

19. The method of claim 14, wherein the forming of the spreader layer comprises forming the spreader layer such that the edge region of the spreader layer is located around a periphery of the spreader layer in a first direction from the central region and in a second direction from the central region perpendicular to the first direction, and at least one of:
- a size of the plurality of thermally conductive structures decreases in the first direction from the central region to the edge region;
- a size of the plurality of thermally conductive structures decreases in the second direction from the central region to the edge region;
- a size of the plurality of spreader layer spaces increases in the first direction from the central region to the edge region; or
- a size of the plurality of spreader layer spaces increases in the second direction from the central region to the edge region.

20. A radio frequency (RF) transceiver system for a communication device, comprising:
- an antenna;
- an RF component section including a plurality of RF components; and
- a switching module coupled to both the antenna and the RF component section, including a plurality of switches for switching a signal transmission path between the antenna and the plurality of RF components, each switch of the plurality of switches comprising:
  - a heater layer;
  - a phase change material (PCM) layer on the heater layer; and
  - a spreader layer formed in proximity to the PCM layer, wherein the spreader layer comprises:
    - a central region with a first thermal conductivity; and
    - an edge region with a second thermal conductivity different than the first thermal conductivity.

* * * * *